United States Patent
Shinohara et al.

(10) Patent No.: US 6,765,285 B2
(45) Date of Patent: Jul. 20, 2004

(54) POWER SEMICONDUCTOR DEVICE WITH HIGH RADIATING EFFICIENCY

(75) Inventors: Toshiaki Shinohara, Fukuoka (JP); Takanobu Yoshida, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/378,840

(22) Filed: Mar. 5, 2003

(65) Prior Publication Data

US 2004/0061138 A1 Apr. 1, 2004

(30) Foreign Application Priority Data

Sep. 26, 2002  (JP) ........................................ 2002-280665

(51) Int. Cl.$^7$ .............................................. H01L 25/04
(52) U.S. Cl. ...................... 257/678; 257/712; 257/714; 257/778
(58) Field of Search ................................ 257/678, 714, 257/719, 723, 712, 778

(56) References Cited

U.S. PATENT DOCUMENTS

| | | | | |
|---|---|---|---|---|
| 4,928,207 A | * | 5/1990 | Chrysler et al. ............ 361/700 |
| 4,996,589 A | * | 2/1991 | Kajiwara et al. ............ 257/714 |
| 5,198,889 A | * | 3/1993 | Hisano et al. ............... 257/678 |
| 5,672,548 A | * | 9/1997 | Culnane et al. ............. 438/118 |
| 6,313,520 B1 | | 11/2001 | Yoshida et al. |
| 2002/0185718 A1 | * | 12/2002 | Mikubo et al. ............. 257/678 |

FOREIGN PATENT DOCUMENTS

| JP | 60-37756 | 2/1985 |
|---|---|---|
| JP | 61-59741 | 3/1986 |
| JP | 2-166758 | 6/1990 |
| JP | 10-51169 | 2/1998 |
| JP | 2001-250911 | 9/2001 |

* cited by examiner

*Primary Examiner*—David Nelms
*Assistant Examiner*—Dao H. Nguyen
(74) *Attorney, Agent, or Firm*—Oblon, Spivak, McClelland, Maier & Neustadt, P.C.

(57) ABSTRACT

A discrete semiconductor device is vertically sandwiched between an upper wall of a case body and a case bottom plate to be fixed inside a case. The discrete semiconductor device is fitted in the case to be positioned on a predetermined portion inside the case with high accuracy. A space defined by a side surface of the discrete semiconductor device and an inner wall of the case forms a duct for a coolant used for cooling the discrete semiconductor device. The discrete semiconductor device, except main electrodes and signal terminals, is immersed in the coolant. With this structure provided is a power semiconductor device which allows an increase in radiating efficiency of a power semiconductor element and reduction in manufacturing cost.

21 Claims, 35 Drawing Sheets

F I G. 2
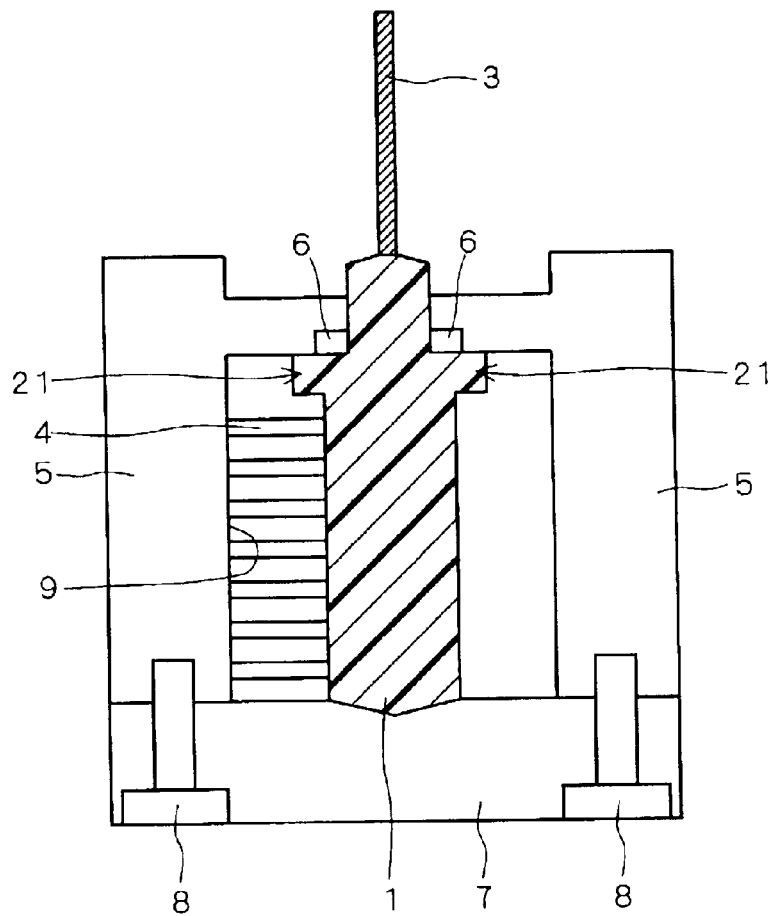
F I G. 3
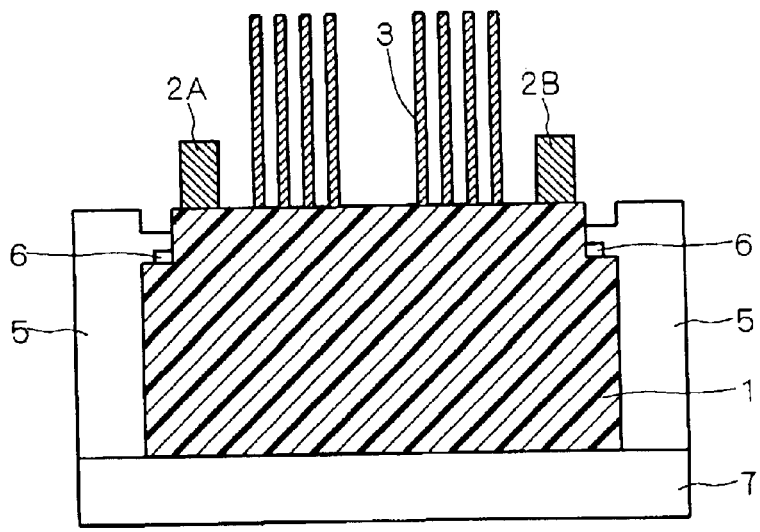

F I G. 1 0
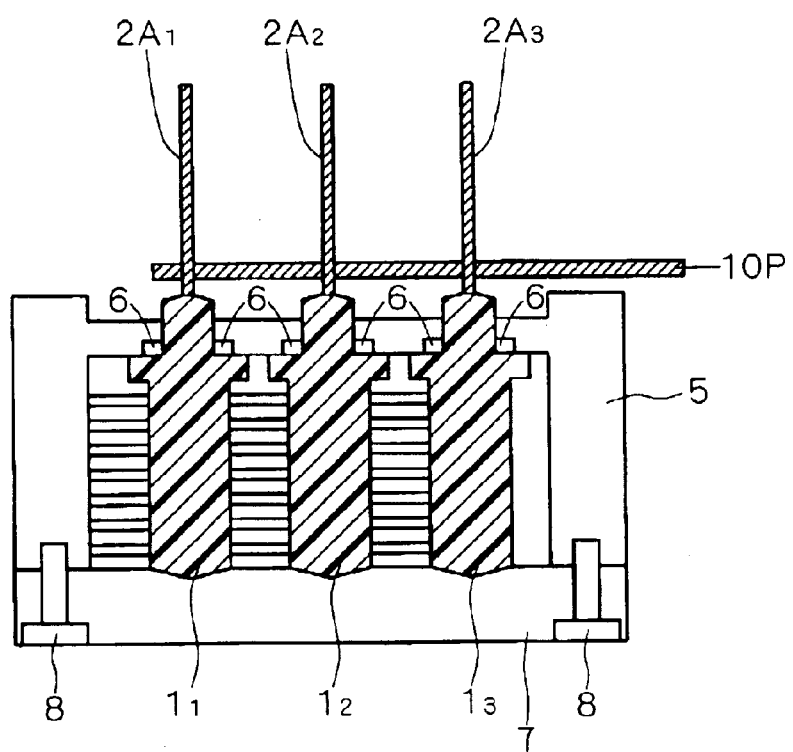

F I G. 1 2
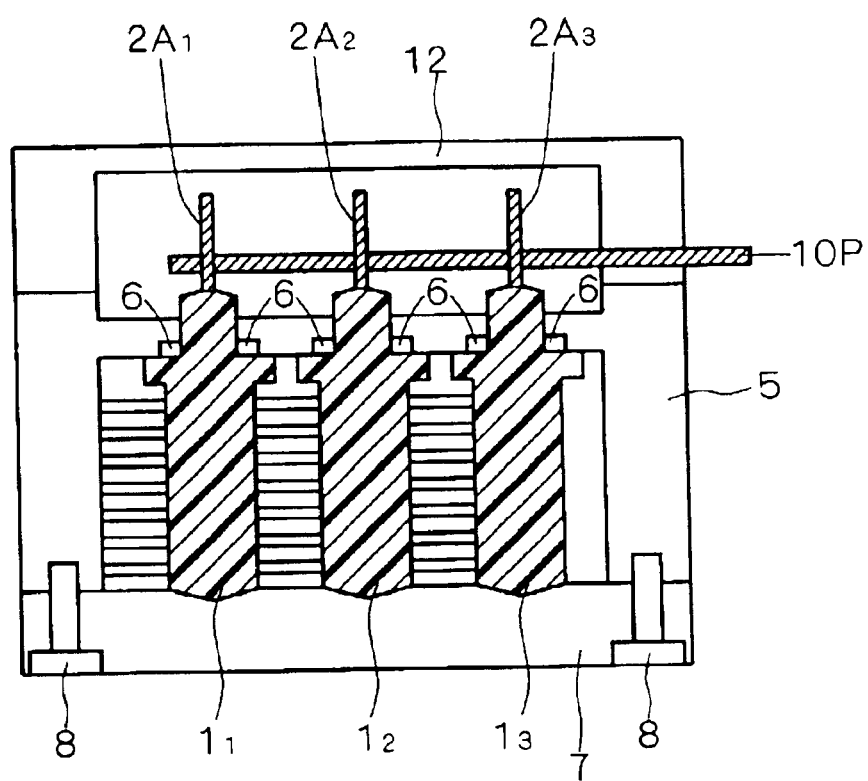

F I G. 16
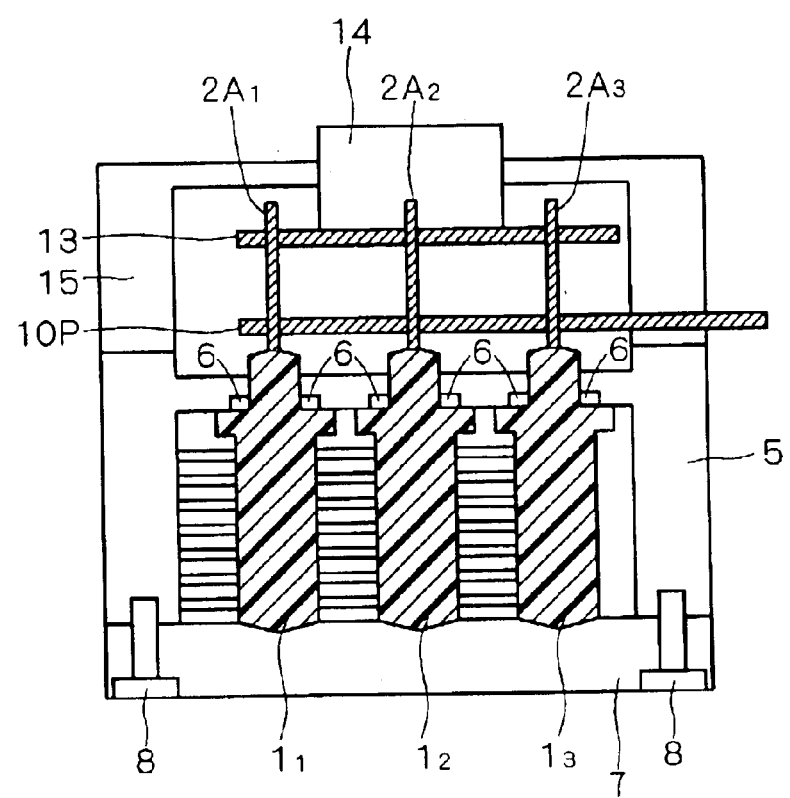

POWER SEMICONDUCTOR DEVICE WITH HIGH RADIATING EFFICIENCY

BACKGROUND OF THE INVENTION

1. Field of the Invention

The present invention relates to a power semiconductor device having a structure in which at least one discrete semiconductor device is disposed in a case.

2. Description of the Background Art

In a background-art power semiconductor device, a resin-sealed power semiconductor element is mounted on a cooling fin with grease interposed therebetween, to radiate the heat of the power semiconductor element (see e.g., Patent Document 1).

<Patent Document 1> Japanese Patent Application Laid Open Gazette No. 2001-250911.

The background-art power semiconductor device, however, has a problem that it is impossible to ensure sufficient heat radiation since the thermal conductivity of grease is low.

Further, since the flatness of a surface for mounting the fin has a great influence on the heat radiation, the fin mounting surface needs high-level flatness and this raises a problem that the manufacturing cost increases.

SUMMARY OF THE INVENTION

It is an object of the present invention to provide a power semiconductor device which allows an increase in radiating efficiency of a power semiconductor element and reduction in manufacturing cost.

The present invention is intended for a power semiconductor device. According to the present invention, the power semiconductor device includes a hollow case and a discrete semiconductor device having a terminal for external connection. The discrete semiconductor device is fitted in the case to be positioned and disposed on a predetermined portion inside the case with the terminal protruding outside from the case. A space defined by a surface of the discrete semiconductor device and an inner wall of the case forms a duct for a coolant used for cooling the discrete semiconductor device which is immersed therein.

The discrete semiconductor device is immersed in the coolant. Therefore, the discrete semiconductor device can be directly cooled by the coolant and this enhances the cooling efficiency of the discrete semiconductor device.

Further, the discrete semiconductor device is fitted in the case to be positioned and disposed on a predetermined portion inside the case. This enhances the mounting accuracy of a control circuit substrate and the like.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a cross section showing a cross-sectional structure taken along the line II—II of FIG. 1;

FIG. 3 is a cross section showing a cross-sectional structure taken along the line III—III of FIG. 1;

FIG. 10 is a cross section showing a cross-sectional structure taken along the line X—X of FIG. 9;

FIG. 12 is a cross section showing a cross-sectional structure taken along the line XII—XII of FIG. 11;

FIG. 16 is a cross section showing a cross-sectional structure taken along the line XVI—XVI of FIG. 15;

DESCRIPTION OF THE PREFERRED EMBODIMENTS

First Preferred Embodiment

Figure 1:
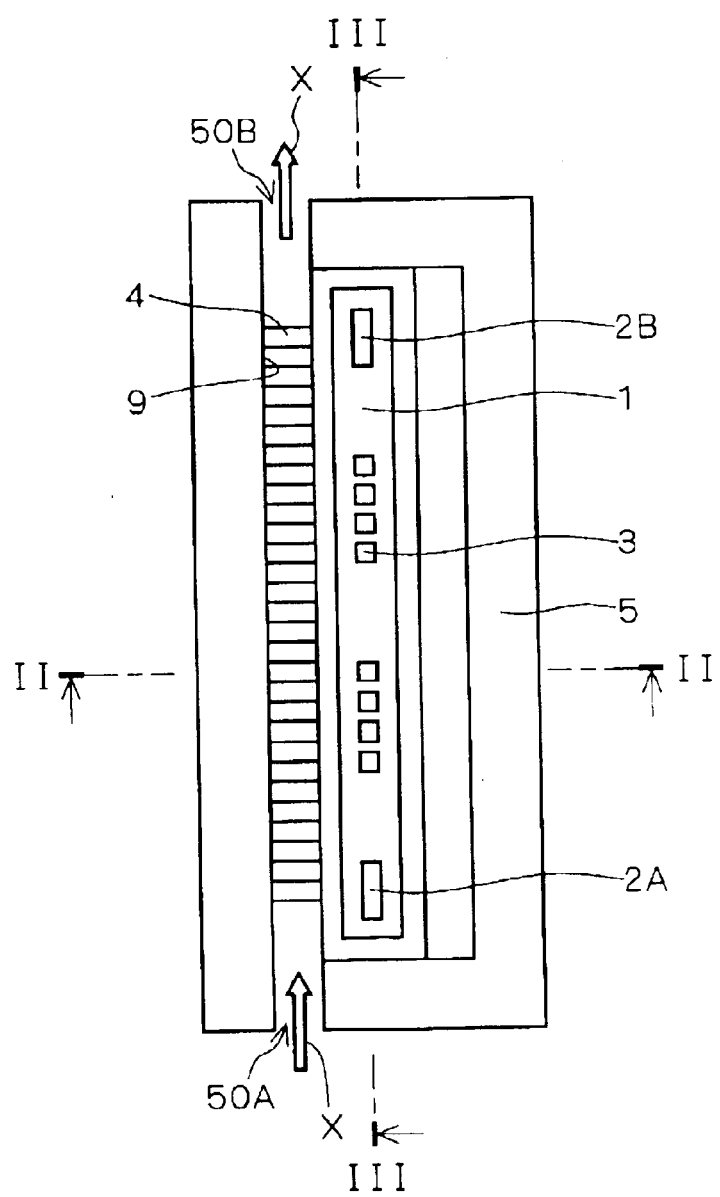
FIG. 1 is a top plan view showing a structure of a power semiconductor device in accordance with a first preferred embodiment of the present invention.

FIG. 1 is a top plan view showing a structure of a power semiconductor device in accordance with a first preferred embodiment of the present invention, and FIGS. 2 and 3 are cross sections showing cross-sectional structures taken along the lines II—II and III—III of FIG. 1, respectively. In FIG. 1, an upper wall of a case is not shown.

Referring to FIGS. 1 to 3, the power semiconductor device of the first preferred embodiment has a case consisting of a case body 5 and a case bottom plate 7 and a discrete semiconductor device 1. The discrete semiconductor device 1 has a structure in which a power semiconductor element such as an IGBT is sealed with a mold resin. This enhances the water resistance of the power semiconductor element against a coolant discussed later. The case body 5 and the case bottom plate 7 are fixed to each other with screws 8. Instead of the resin, the power semiconductor element may be sealed with other material.

The discrete semiconductor device 1 has terminals for external connection (main electrodes 2A and 2B and signal terminals 3). All the main electrodes 2A and 2B and the signal terminals 3 protrude from one surface (herein, an upper surface) of the discrete semiconductor device 1. This allows an easy mounting of busbars or a control circuit substrate discussed later.

The discrete semiconductor device 1 is vertically sandwiched between the upper wall of the case body 5 and the case bottom plate 7, to be fixed inside the case. This allows an easy fixing of the discrete semiconductor device 1 and the case and ensures downsizing of the discrete semiconductor device 1 since there is no need to provide the discrete semiconductor device 1 with tapped holes. The discrete semiconductor device 1 has a positioning structure 21 to be fitted in the shape of the upper wall of the case body 5. The upper wall of the case body 5 is provided with an insertion hole in which the shape of a top of the discrete semiconductor device 1 is fitted. The case bottom plate 7 is provided with a V-shaped groove in which the shape of a bottom of the discrete semiconductor device 1 is fitted. With these structures, the discrete semiconductor device 1 is fitted in the case to be positioned on a predetermined portion inside the case with high accuracy. This enhances the accuracy of mounting the control circuit substrate and the like discussed later. The main electrodes 2A and 2B and the signal terminals 3 protrude out of the case.

A space defined by a side surface of the discrete semiconductor device 1 and an inner wall of the case forms a duct 9 for the coolant (e.g., cold water) used for cooling the discrete semiconductor device 1. The discrete semiconductor device 1, except the main electrodes 2A and 2B and the signal terminals 3, is immersed in the coolant. Providing a sealing material 6 at a contact between the discrete semiconductor device 1 and the case body 5 prevents the coolant from leaking out of the case from the upper wall of the case.

A fin 4 is provided on the side surface of the discrete semiconductor device 1 and immersed in the coolant. This enhances the cooling efficiency of the discrete semiconductor device 1. When the fin 4 is made of a mold resin, the fin 4 is also formed in a resin sealing process for the power semiconductor element and this ensures reduction in manufacturing cost. By providing the side surface of the discrete semiconductor device 1 with a lot of irregularities, instead of forming the fin 4 on the side surface of the discrete semiconductor device 1, the area of contact between the discrete semiconductor device 1 and the coolant increases and this enhances the cooling efficiency of the discrete semiconductor device 1. Referring to FIG. 1, as indicated by the arrow X, the coolant flows from a coolant inlet 50A into the case, going along the duct 9 while cooling the discrete semiconductor device 1, and then flows out of the case from a coolant outlet 50B.

Figure 4:
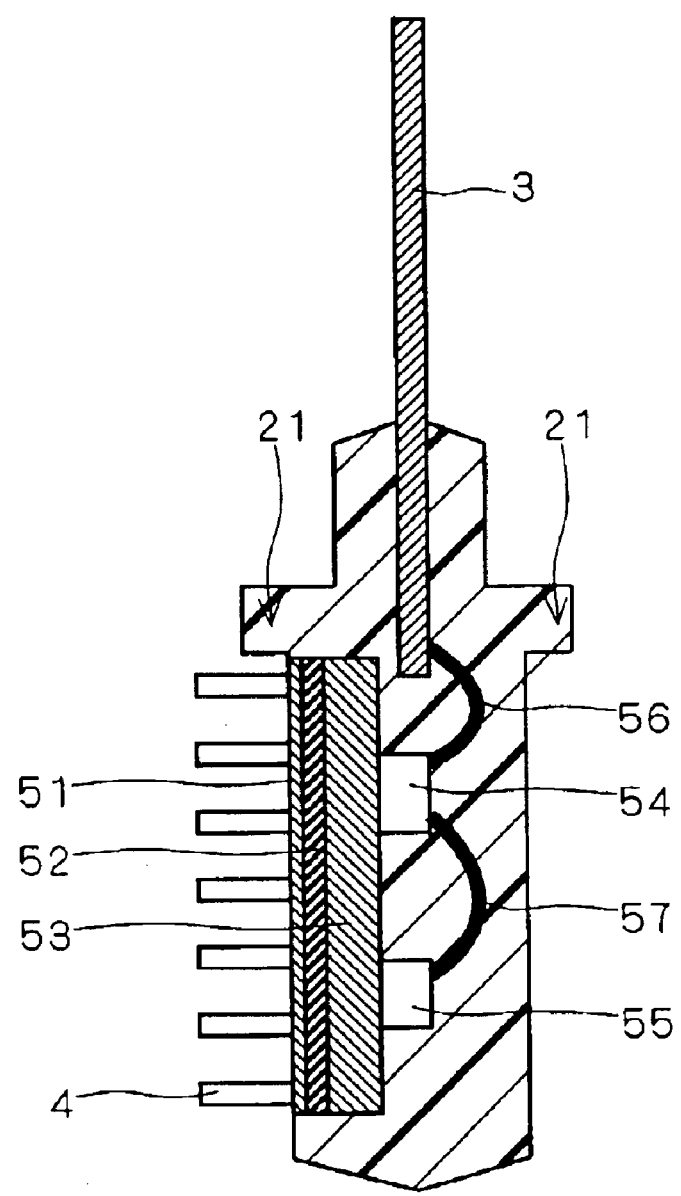
FIG. 4 is a cross section specifically showing a structure of a discrete semiconductor device.

FIG. 4 is a cross section specifically showing a structure of the discrete semiconductor device 1. A substrate is formed by layering a metal film 51 made of copper or the like, an insulating layer 52 made of resin, ceramic or the like and a metal substrate 53 made of copper or the like in this order. The metal film 51 is exposed at the side surface of the discrete semiconductor device 1. The fin 4 is joined to the metal film 51. On the metal substrate 53, the power semiconductor element such as an IGBT 54 and a free wheel diode 55 are mounted. The IGBT 54 and the free wheel diode 55 are connected to each other with a wire 57. The signal terminal 3 and the IGBT 54 are connected to each other with a wire 56.

Figure 5:
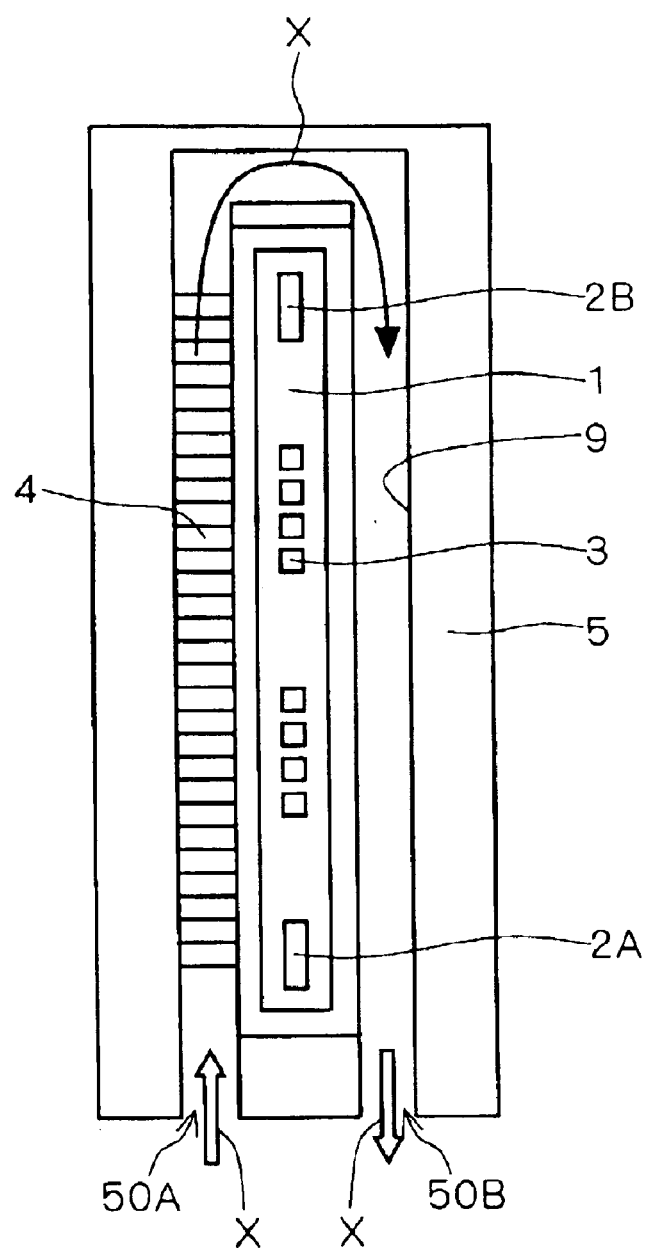
FIG. 5 is a top plan view showing a variation of the first preferred embodiment of the present invention.

FIG. 5 is a top plan view showing a variation of the first preferred embodiment, correspondingly to FIG. 1. Though the duct 9 for the coolant is linear in the case of FIG. 1, the duct 9 has a U shape in the case of FIG. 5. As indicated by the arrow X, the coolant flows from the coolant inlet 50A into the case, going along the duct 9 while cooling a first side surface of the discrete semiconductor device 1 (the side surface on which the fin 4 is provided), then makes a U-turn, further going along the duct 9 while cooling a second side surface of the discrete semiconductor device 1 (the side surface on which the fin 4 is not provided), and flows out of the case from the coolant outlet 50B. This enhances the cooling efficiency of the discrete semiconductor device 1 as compared with the case of FIG. 1. The fin 4 may be also provided on the second side surface of the discrete semiconductor device 1.

Thus, in the power semiconductor device of the first preferred embodiment, the discrete semiconductor device 1 is immersed in the coolant. The discrete semiconductor device 1 can be thereby directly cooled by the coolant and this enhances the cooling efficiency of the discrete semiconductor device 1 as compared with the background-art case. The surface on which the fin 4 is mounted does not need the flatness level as high as that of the background-art device, and this ensures reduction in manufacturing cost.

Second Preferred Embodiment

Figure 6:
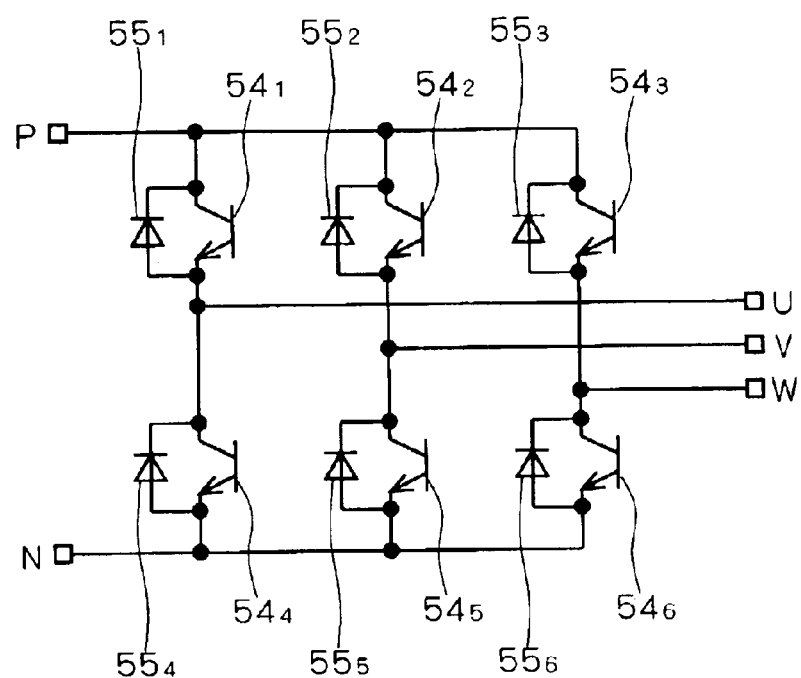
FIG. 6 is a circuit diagram showing a configuration of an inverter circuit.

FIG. 6 is a circuit diagram showing a configuration of an inverter circuit as an example of a power circuit. The inverter circuit consists of six IGBTs $54_1$ to $54_6$ and six free wheel diodes $55_1$ to $55_6$. Referring to FIG. 4, one IGBT 54 and one free wheel diode 55 are incorporated in one discrete semiconductor device 1. Therefore, in order to constitute the inverter circuit of FIG. 6, six discrete semiconductor devices $1_1$ to $1_6$ are needed.

Figure 7:
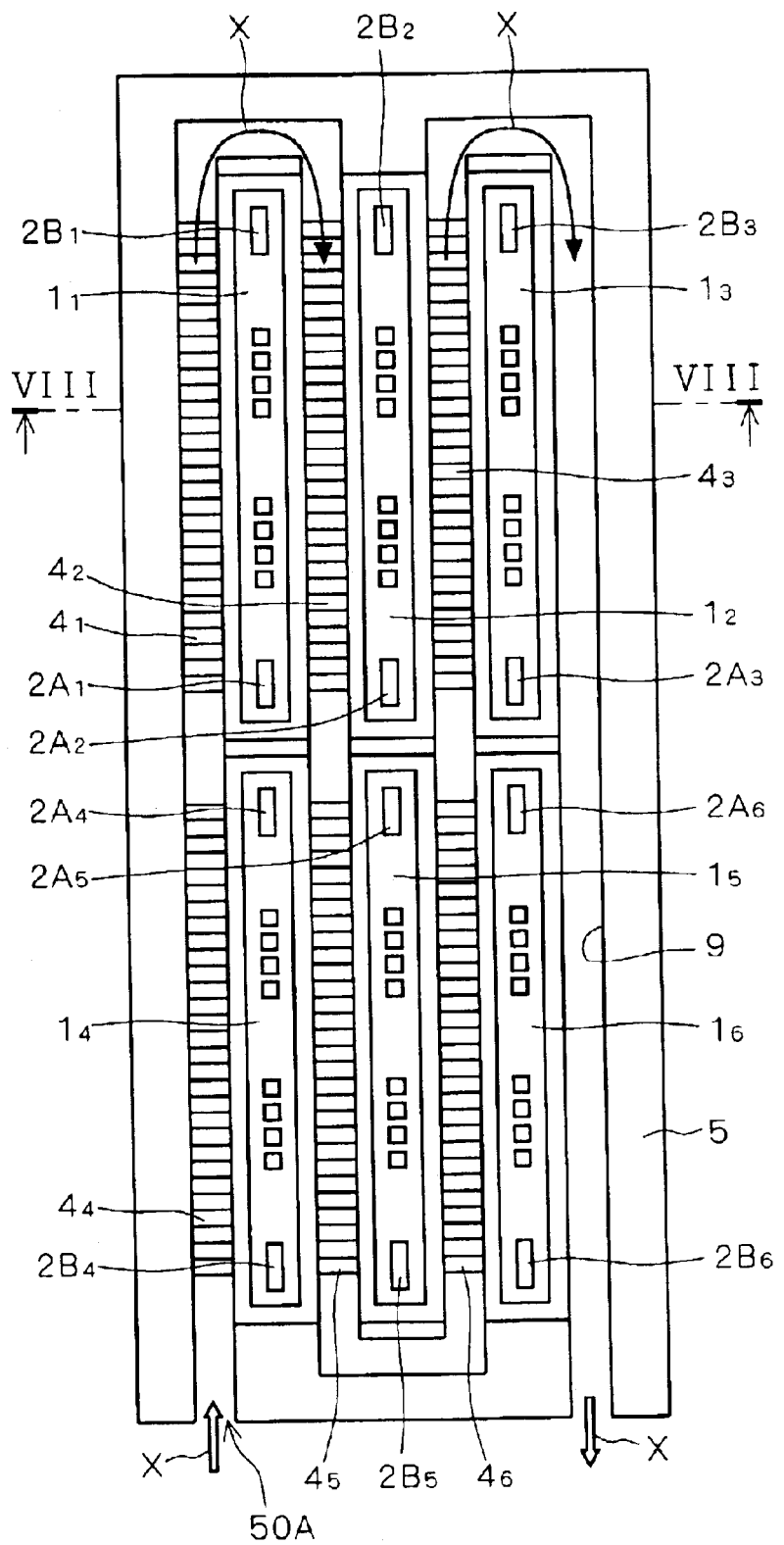
FIG. 7 is a top plan view showing a structure of a power semiconductor device in accordance with a second preferred embodiment of the present invention.
Figure 8:
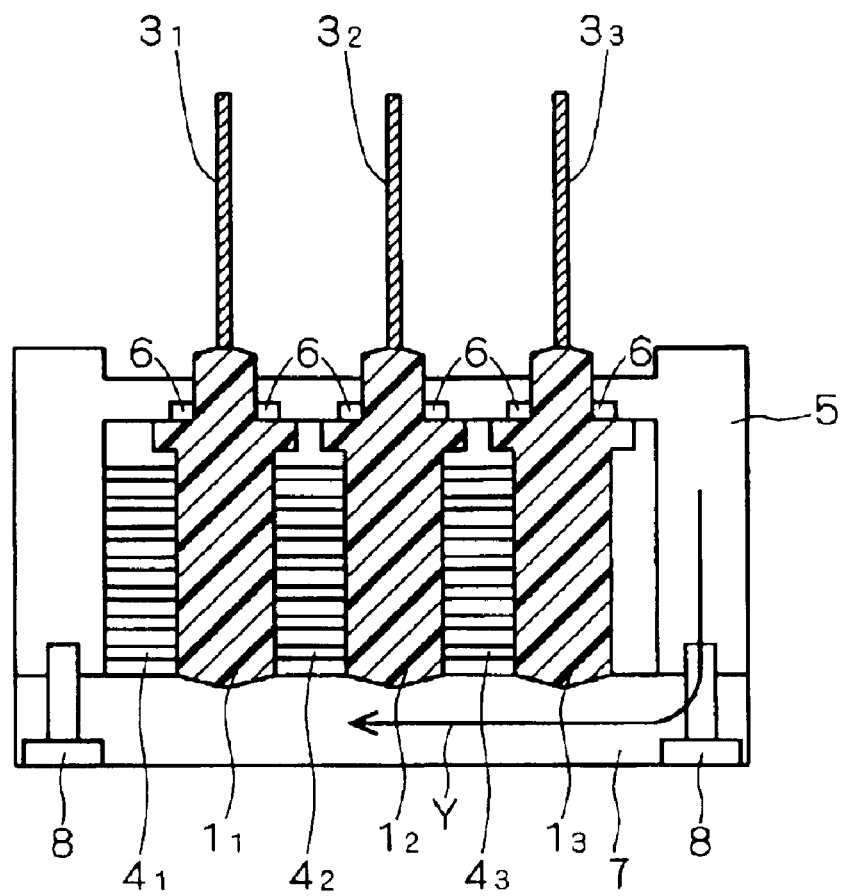
FIG. 8 is a cross section showing a cross-sectional structure taken along the line VIII—VIII of FIG. 7.

FIG. 7 is a top plan view showing a structure of a power semiconductor device in accordance with a second preferred embodiment of the present invention, and FIG. 8 is a cross section showing a cross-sectional structure taken along the line VIII—VIII of FIG. 7. In FIG. 7, the upper wall of the case is not shown. Referring to FIG. 7, a plurality of discrete semiconductor devices $1_1$ to $1_6$ constituting the inverter circuit of FIG. 6 are arranged side by side in a matrix with two rows and three columns in the case. By housing a plurality of discrete semiconductor devices $1_1$ to $1_6$ constituting a desired power circuit in one case 5, it is possible to improve convenience in use. In the case, the meandering duct 9 is defined among the discrete semiconductor devices $1_1$ to $1_6$. The IGBTs $54_1$ to $54_6$ and the free wheel diodes $55_1$ to $55_6$ are incorporated in the discrete semiconductor devices $1_1$ to $1_6$, respectively. Other element may be also incorporated therein.

Referring to FIG. 8, the case has the case body 5 and the case bottom plate 7 which are fixed to each other with screws 8. In an assembly process for the power semiconductor device, a plurality of discrete semiconductor devices $1_1$ to $1_6$ are vertically sandwiched between the upper wall of the case body 5 and the case bottom plate 7 to be fixed inside the case. This allows an easy assembly of the power semiconductor device.

When there is a difference in calorific value among the discrete semiconductor devices 11 to 16, it is preferable that the discrete semiconductor devices $1_1$ to $1_6$ should be disposed from an upstream side of the duct 9 for the coolant (nearer to the coolant inlet 50A) in descending order of calorific value. Specifically, one of the discrete semiconductor devices $1_1$ to $1_6$ which has the largest calorific value is disposed at the portion where the discrete semiconductor device 14 is disposed in FIG. 7. This allows an effective cooling where the discrete semiconductor devices 1 having a larger calorific value can be cooled by the coolant of low temperature.

Figure 9:
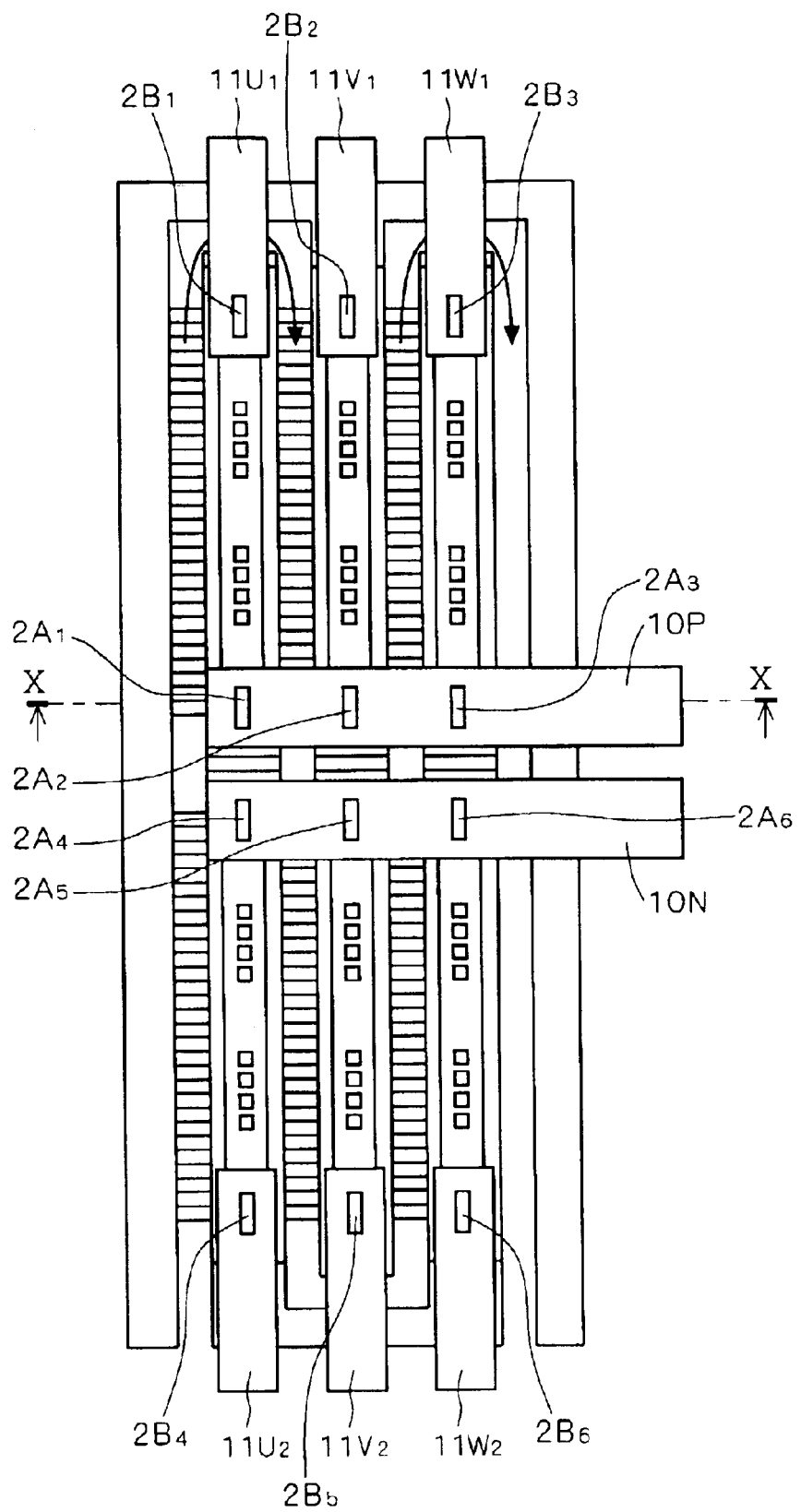
FIG. 9 is a top plan view showing a state where busbars are connected to the structure of FIG. 7.

FIG. 9 is a top plan view showing a state where busbars are connected to the structure of FIG. 7, and FIG. 10 is a cross section showing a cross-sectional structure taken along the line X—X of FIG. 9. In FIG. 9, the upper wall of the case is not shown. An input busbar 10P is connected in common to main electrodes $2A_1$ to $2A_3$ and an input busbar 10N is connected in common to main electrodes $2A_4$ to $2A_6$. Since the discrete semiconductor devices $1_1$ to $1_6$ are arranged so that the main electrodes $2A_1$ to $2A_3$ and the main electrodes $2A_4$ to $2A_6$ should be opposed to each other, the busbars 10P and 10N are disposed adjacently and parallelly to each other. Since the flows of currents in the busbars 10P and 10N are inverse in direction, providing the busbars 10P and 10N adjacently to each other can reduce the inductance between the busbars 10P and 10N.

Output busbars $11U_1$, $11V_1$, $11W_1$, $11U_2$, $11V_2$ and $11W_2$ are connected to the main electrodes $2B_1$, $2B_2$, $2B_3$, $2B_4$, $2B_5$ and $2B_6$, respectively.

Figure 11:
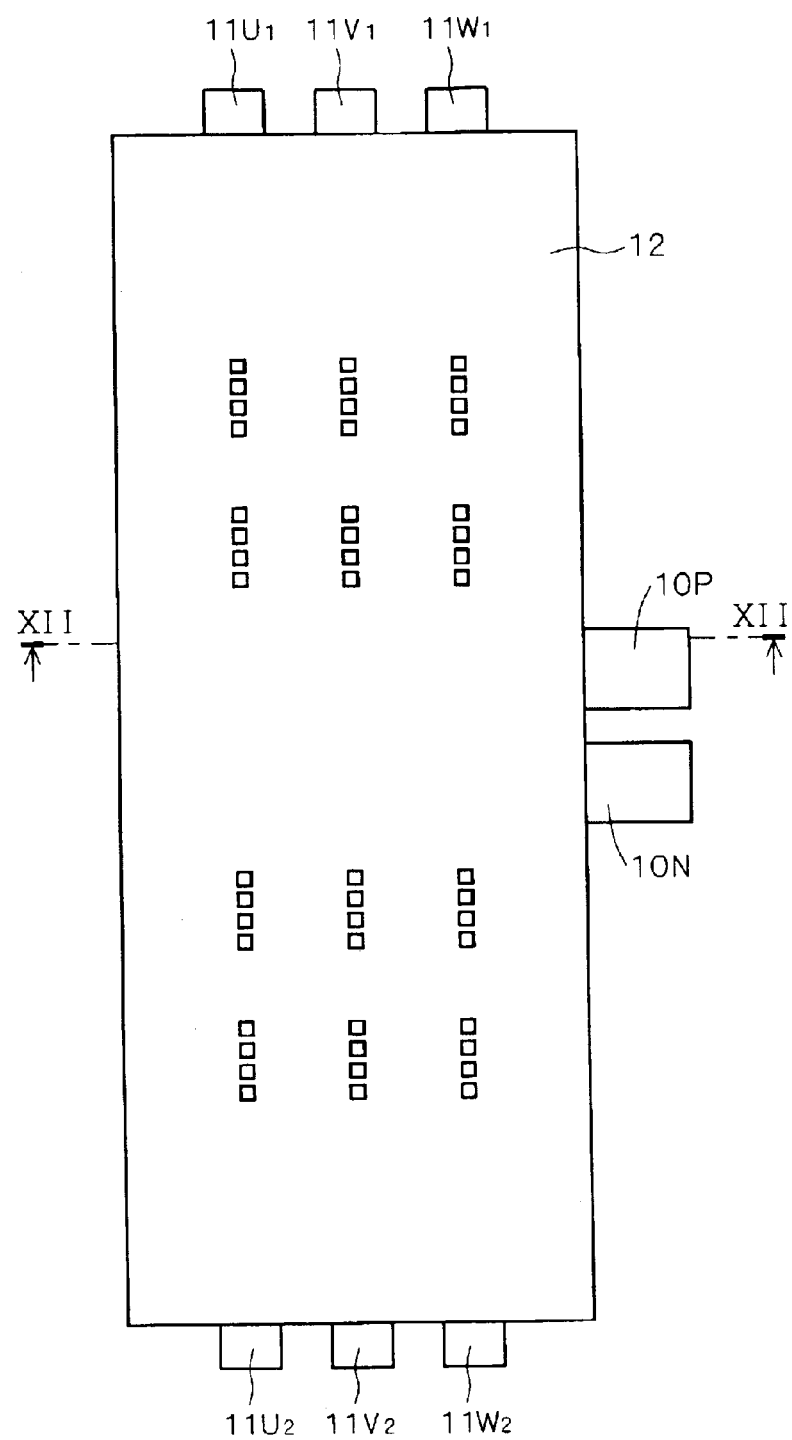
FIG. 11 is a top plan view showing a state where the structure of FIG. 9 is covered with a case cover.

FIG. 11 is a top plan view showing a state where the structure of FIG. 9 is covered with a case cover 12, and FIG. 12 is a cross section showing a cross-sectional structure taken along the line XII—XII of FIG. 11. By providing the case cover 12, a module of the power semiconductor device is obtained.

The case body 5, the case bottom plate 7 and the case cover 12 may be made of a metal such as aluminum alloy. This avoids both an effect of noise emanating from the power semiconductor device to the outside and an effect of noise given to the power semiconductor device from the outside.

Figure 13:
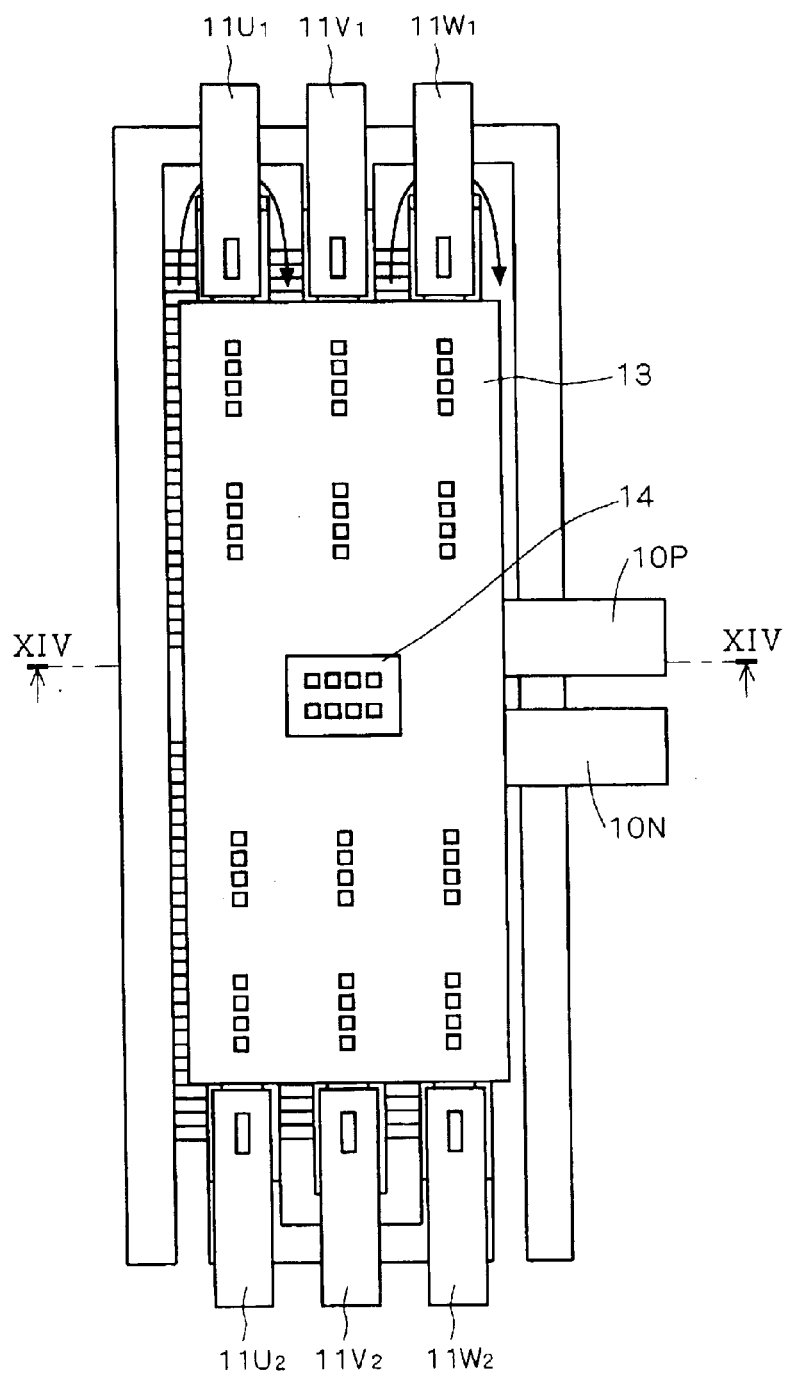
FIG. 13 is a top plan view showing a state where a control circuit substrate is mounted on the structure of FIG. 9.
Figure 14:
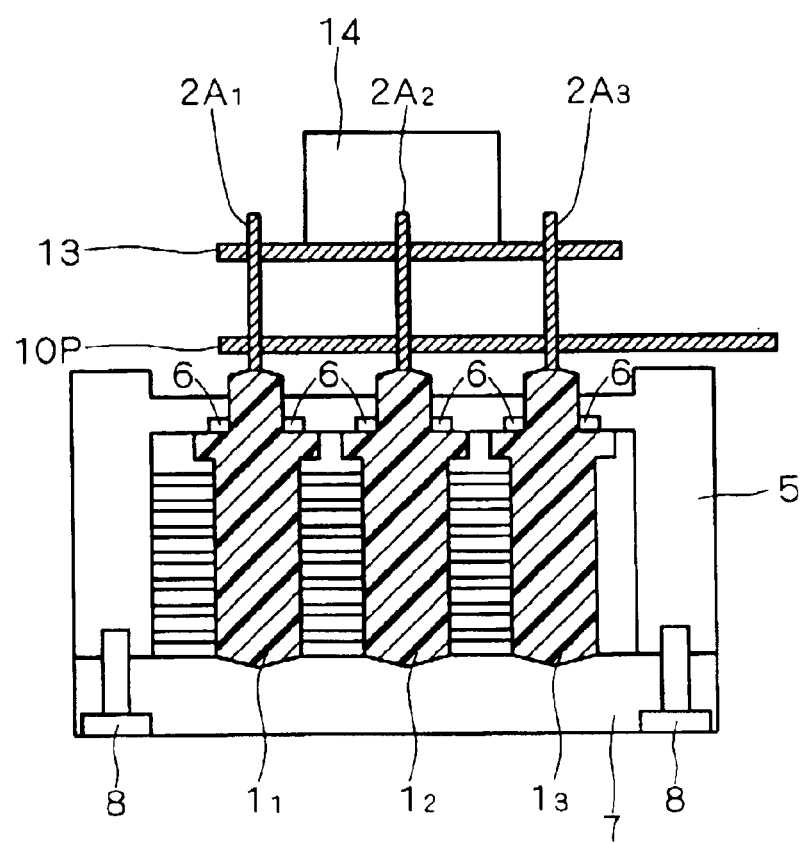
FIG. 14 is a cross section showing a cross-sectional structure taken along the line XIV—XIV of FIG. 13.

FIG. 13 is a top plan view showing a state where a control circuit substrate 13 is mounted on the structure of FIG. 9, and FIG. 14 is a cross section showing a cross-sectional structure taken along the line XIV—XIV of FIG. 13. In FIG. 13, the upper wall of the case is not shown. On the control circuit substrate 13, a control circuit (not shown) is formed to control the discrete semiconductor devices $1_1$ to $1_6$. The control circuit substrate 13 is electrically connected to the discrete semiconductor devices $1_1$ to $1_6$ through the signal terminals 3 (not shown in FIGS. 13 and 14). A connector 14 is provided on the control circuit substrate 13. The control circuit substrate 13 is disposed so that the discrete semiconductor devices $1_1$ to $1_6$ and the control circuit substrate 13 should be perpendicular to each other, and this ensures downsizing of the device.

Figure 15:
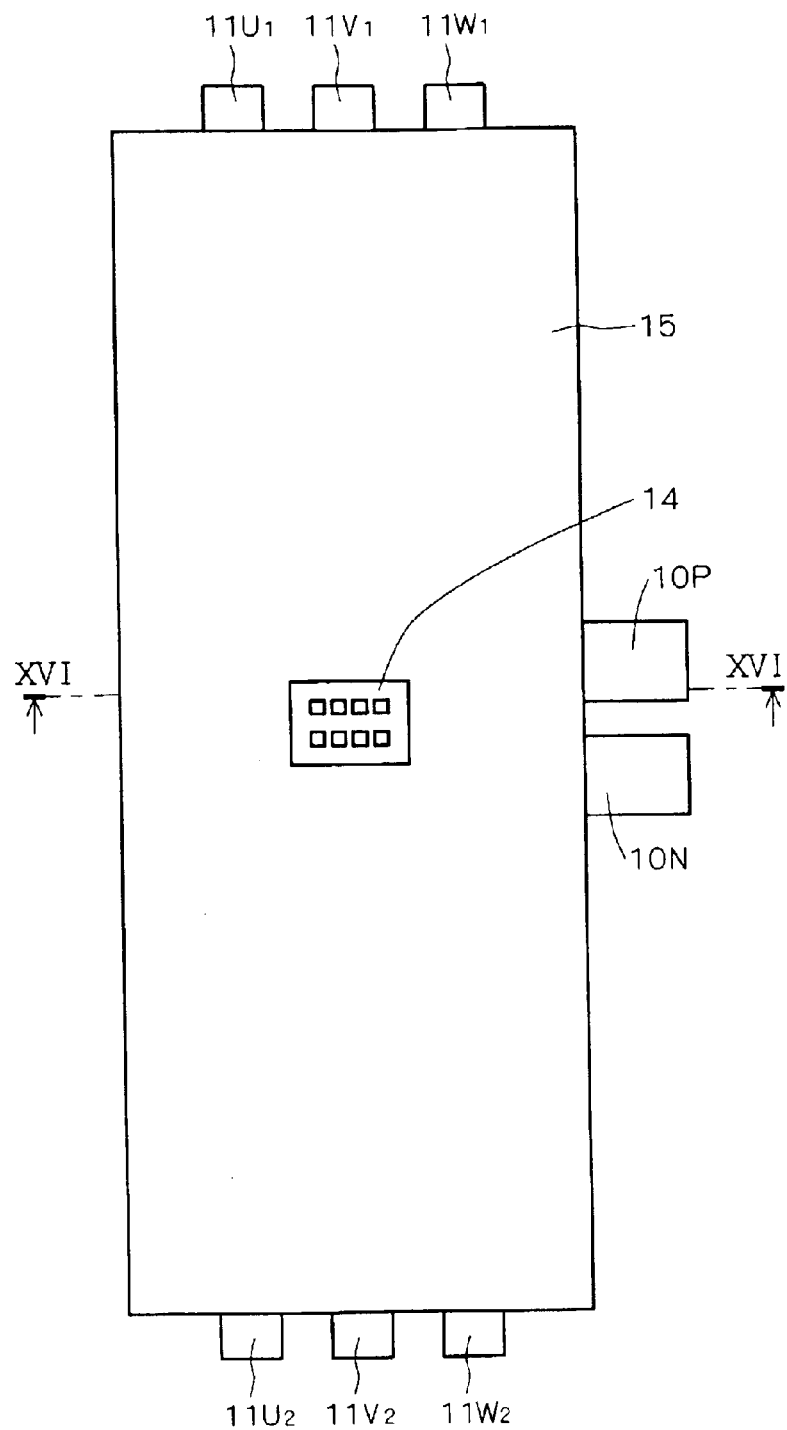
FIG. 15 is a top plan view showing a state where the structure of FIG. 13 is covered with a case cover.

FIG. 15 is a top plan view showing a state where the structure of FIG. 13 is covered with a case cover 15, and FIG. 16 is a cross section showing a cross-sectional structure taken along the line XVI—XVI of FIG. 15. By providing the case body 5 with the case cover 15, a product (IPM) is obtained.

The case body 5, the case bottom plate 7 and the case cover 15 may be made of a metal such as aluminum alloy. This avoids both an effect of electromagnetic noise emanating from the power semiconductor device to the outside and an effect of electromagnetic noise given to the power semiconductor device from the outside.

Figure 17:
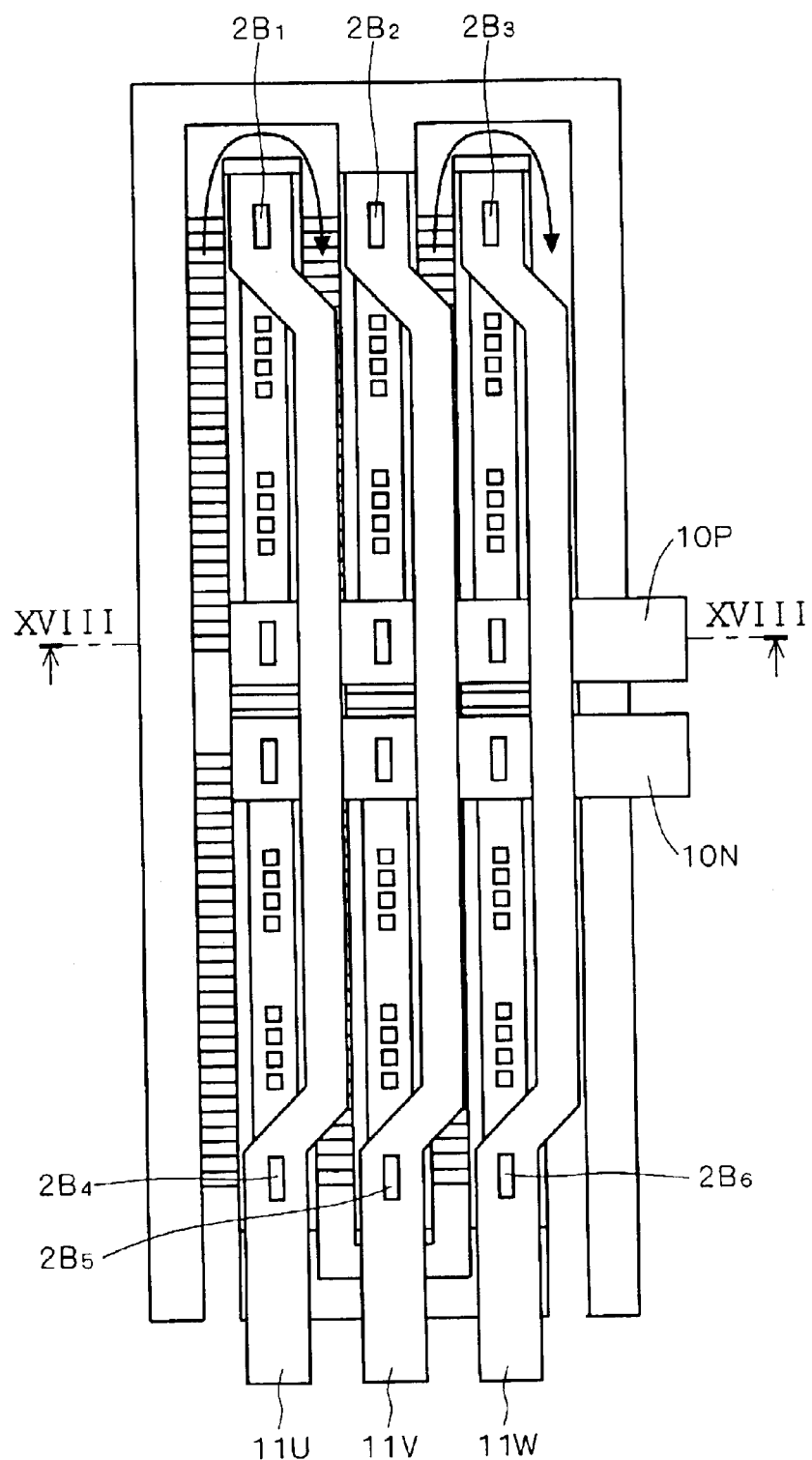
FIG. 17 is a top plan view showing a variation of the second preferred embodiment of the present invention.
Figure 18:
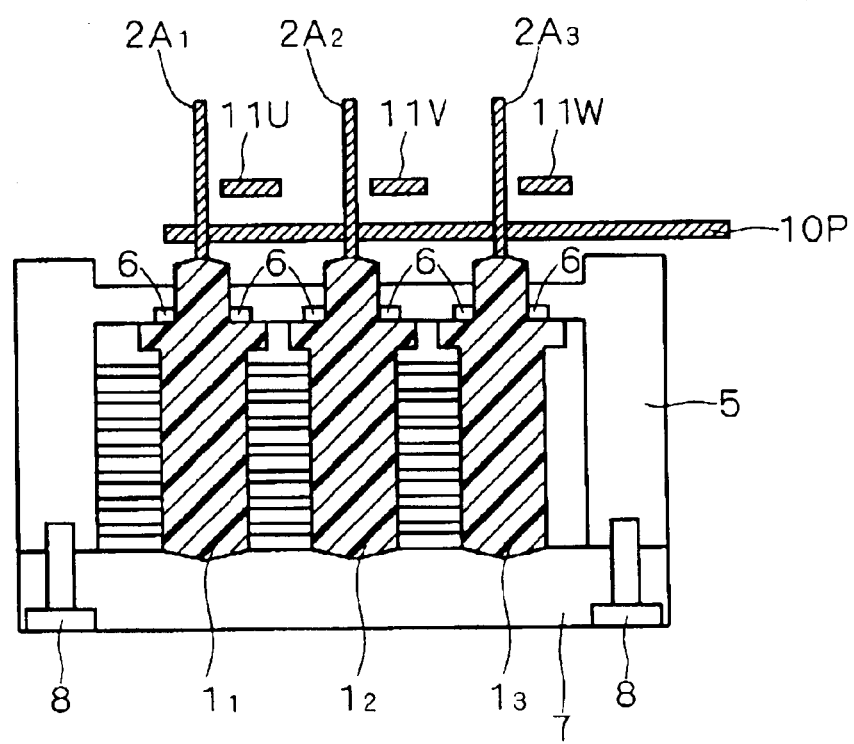
FIG. 18 is a cross section showing a cross-sectional structure taken along the line XVIII—XVIII of FIG. 17.

FIG. 17 is a top plan view showing a variation of the second preferred embodiment, correspondingly to FIG. 9, and FIG. 18 is a cross section showing a cross-sectional structure taken along the line XVIII—XVIII of FIG. 17. The main electrodes $2B_1$ and $2B_4$ are connected to the busbar 11U, the main electrodes $2B_2$ and $2B_5$ are connected to the busbar 11V and the main electrodes $2B_3$ and $2B_6$ are connected to the busbar 11W. In order to avoid the contact between the busbars 11U to 11W and the busbars 10P and 10N, the busbars 11U to 11W are disposed above the busbars 10P and 10N. In other words, the busbars 11U to 11W and the busbars 10P and 10N grade-separately intersect each other. In order to avoid the contact between the busbars 11U to 11W and the main electrodes $2A_1$ to $2A_6$, the busbars 11U to 11W each have a meandering shape in plan view. In the structure of FIG. 17, it is possible to draw the output busbars 11U to 11W out from one side.

Figure 19:
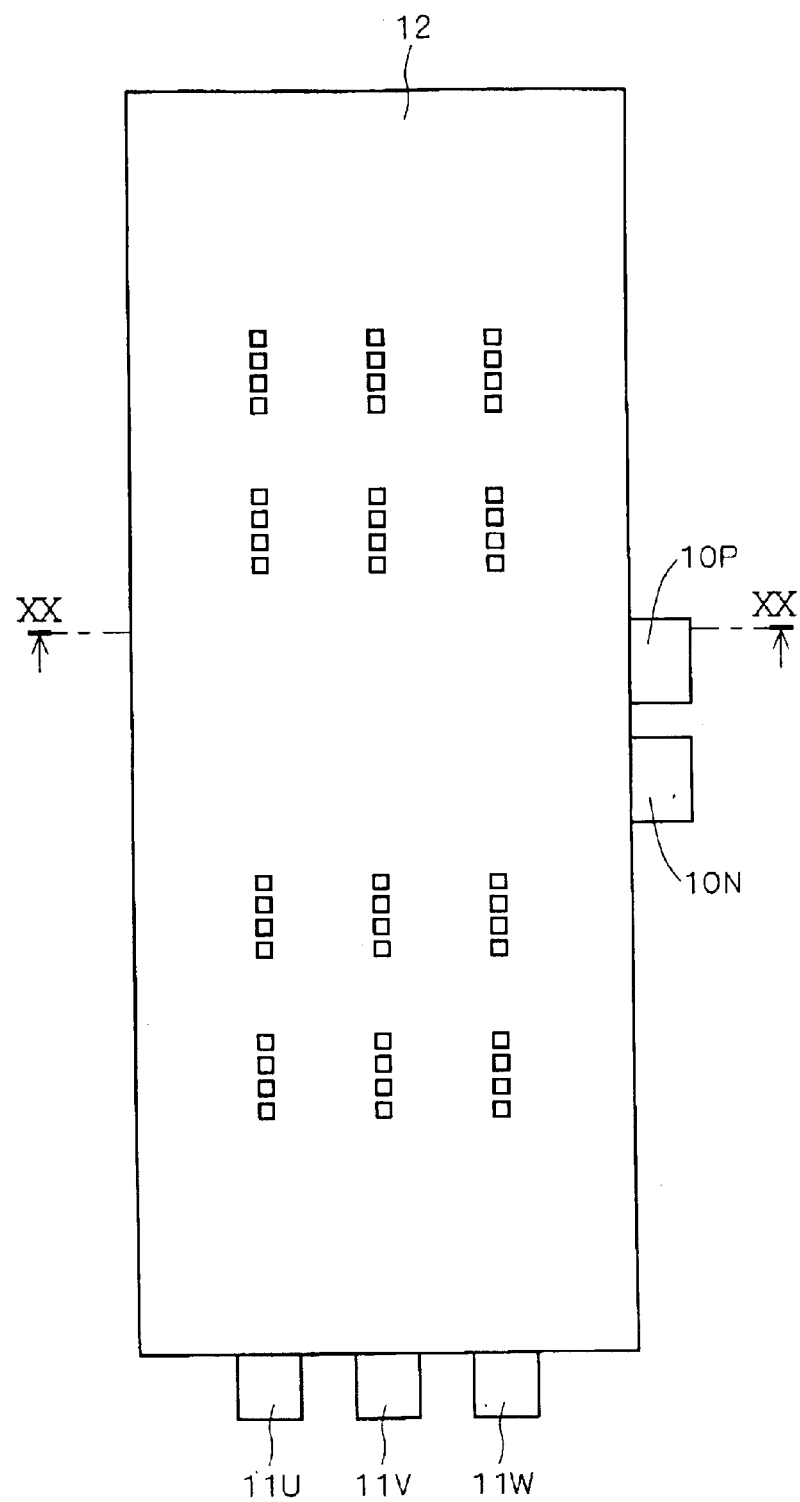
FIG. 19 is a top plan view showing a state where the structure of FIG. 17 is covered with a case cover.
Figure 20:
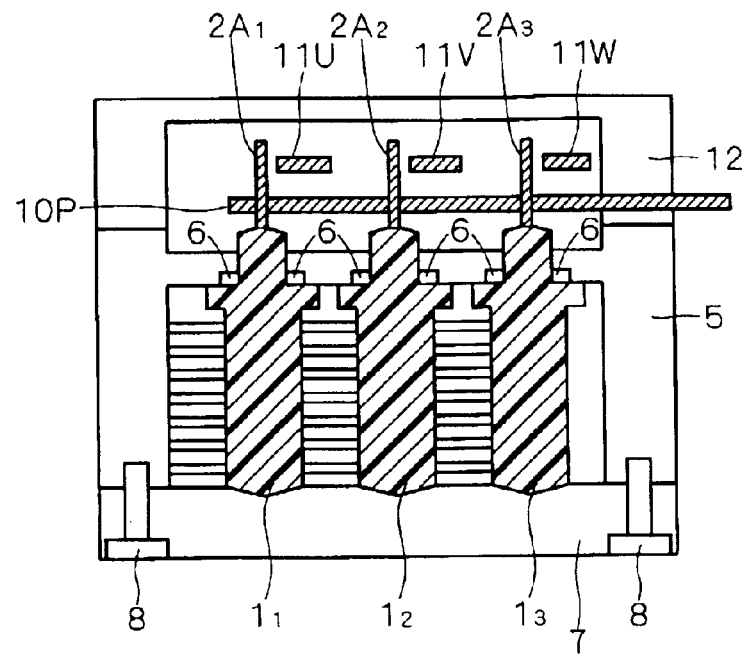
FIG. 20 is a cross section showing a cross-sectional structure taken along the line XX—XX of FIG. 19.

FIG. 19 is a top plan view showing a state where the structure of FIG. 17 is covered with the case cover 12, and FIG. 20 is a cross section showing a cross-sectional structure taken along the line XX—XX of FIG. 19. By providing the case cover 12, a module of the power semiconductor device is obtained. Like in FIGS. 15 and 16, by providing the control circuit substrate 13 and the case cover 15, an IPM is obtained.

Third Preferred Embodiment

Figure 21:
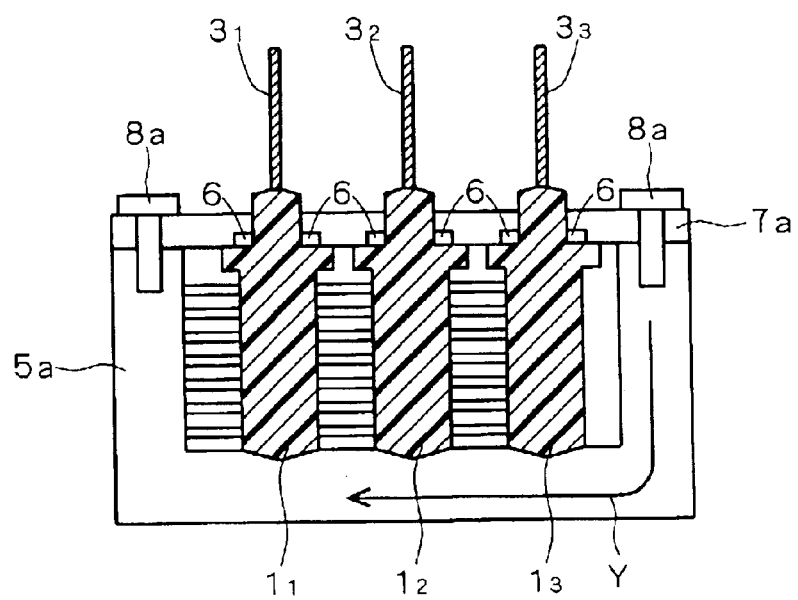
FIG. 21 is a cross section showing a structure of a power semiconductor device in accordance with a third preferred embodiment of the present invention.

FIG. 21 is a cross section showing a structure of a power semiconductor device in accordance with a third preferred embodiment of the present invention, correspondingly to FIG. 8. Instead of the case body 5 and the case bottom plate 7 which are fixed to each other with the screws 8, a case body 5a and a case top plate 7a which are fixed to each other with screws 8a are provided. The case body 5a forms side walls and a bottom wall of the case as one unit.

In the structure of FIG. 8, the coolant contacts the case body 5 and the case bottom plate 7 which are physically separated. Therefore, the thermal resistance at the contact between the case body 5 and the case bottom plate 7 avoids the reflux of heat (indicated by the arrow Y) through the case. In contrast to this, the coolant contacts the case body 5a formed as one unit in the power semiconductor device of the third preferred embodiment. Therefore, the reflux of heat caused by the difference between the temperature near the coolant inlet 50A and that near the coolant outlet 50B is effectively made through the case. As a result, it is possible to suppress variation in temperature distribution in the case and ensure equalization in cooling efficiency. If at least the case body 5a is made of a metal such as aluminum alloy, the above effect becomes remarkable.

Fourth Preferred Embodiment

Figure 22:
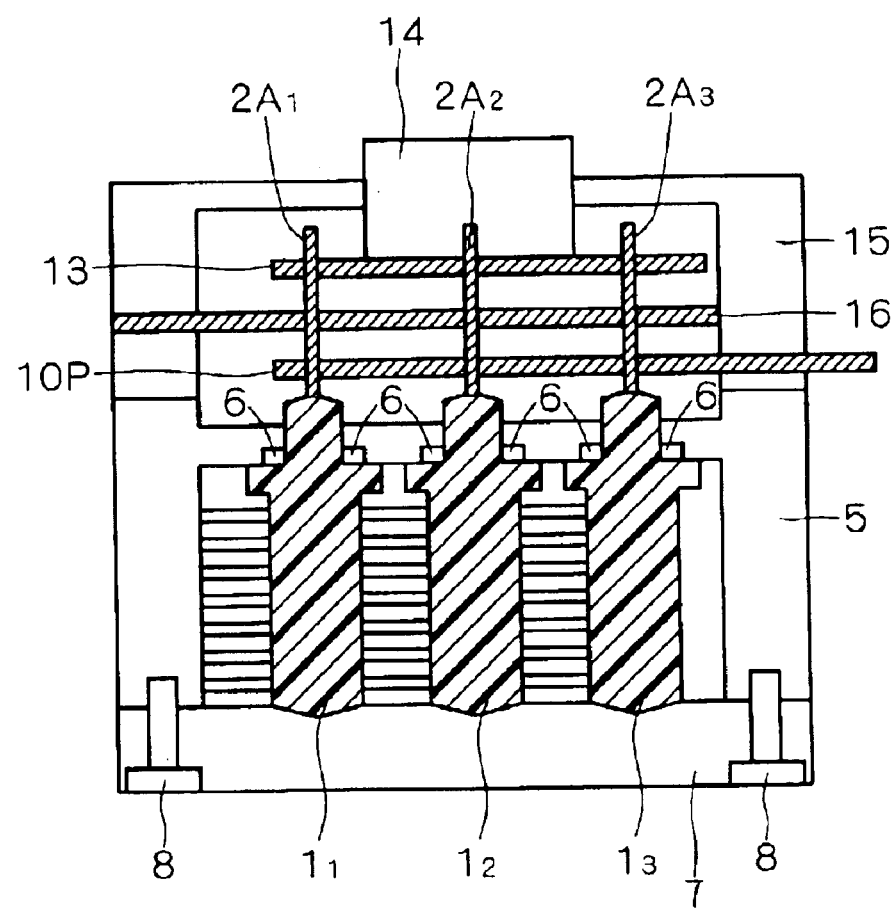
FIG. 22 is a cross section showing a structure of a power semiconductor device in accordance with a fourth preferred embodiment of the present invention.

FIG. 22 is a cross section showing a structure of a power semiconductor device in accordance with a fourth preferred embodiment of the present invention, correspondingly to FIG. 16. A metallic shield plate 16 is provided between the busbar 10P and the control circuit substrate 13. The shield plate 16 is disposed across the case in plan view. The shield plate 16 is connected to the cover 15 which is part of the case and the potential of the shield plate 16 is thereby kept at the grand level.

Thus, in the power semiconductor device of the fourth preferred embodiment, by providing the shield plate 16, it is possible to avoid an effect of electromagnetic noise emanating from the discrete semiconductor devices $1_1$ to $1_6$ and the busbars 10P and 10N and 11U to 11W on the control circuit and prevent a malfunction.

Fifth Preferred Embodiment

Figure 23:
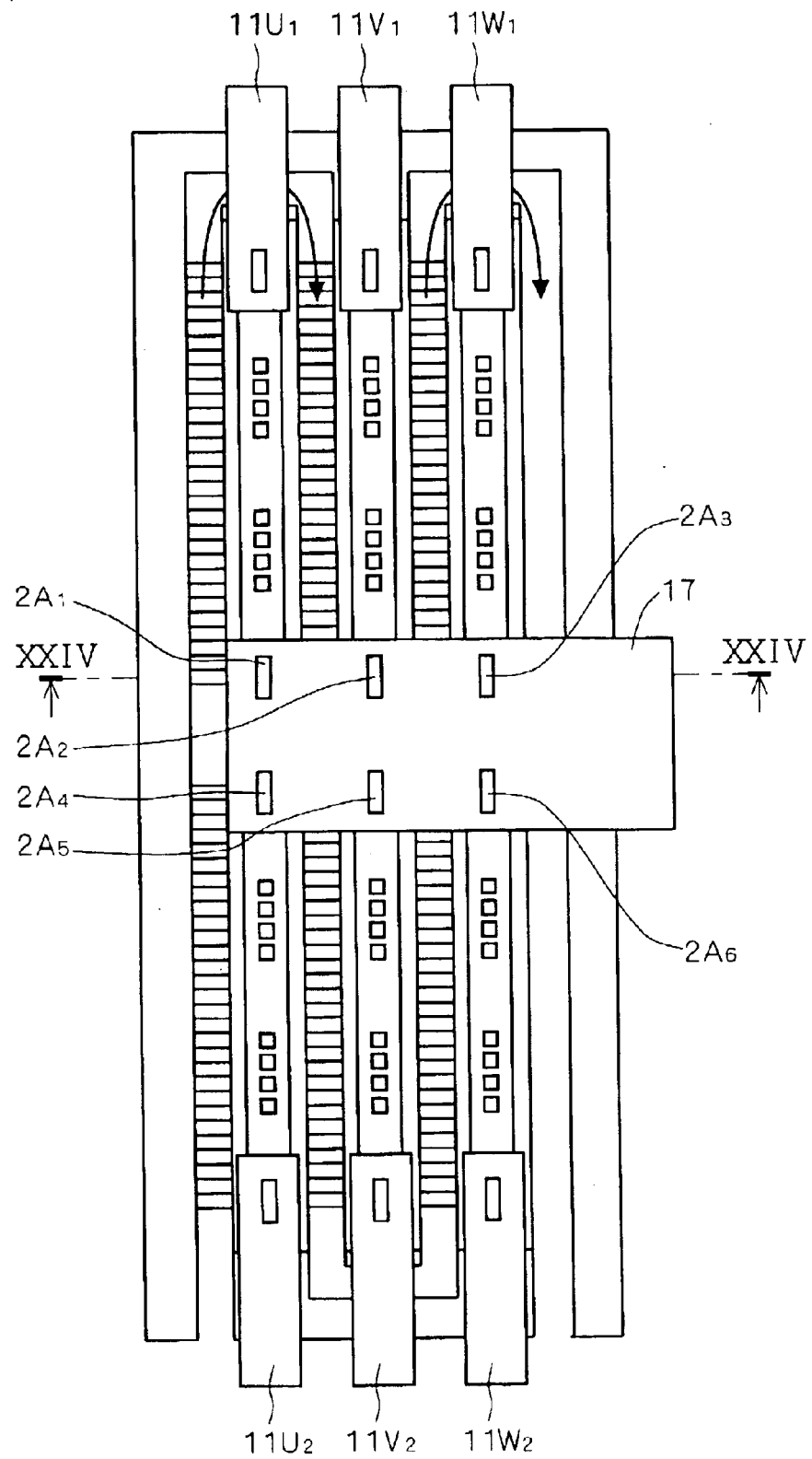
FIG. 23 is a top plan view showing a structure of a power semiconductor device in accordance with a fifth preferred embodiment of the present invention.
Figure 24:
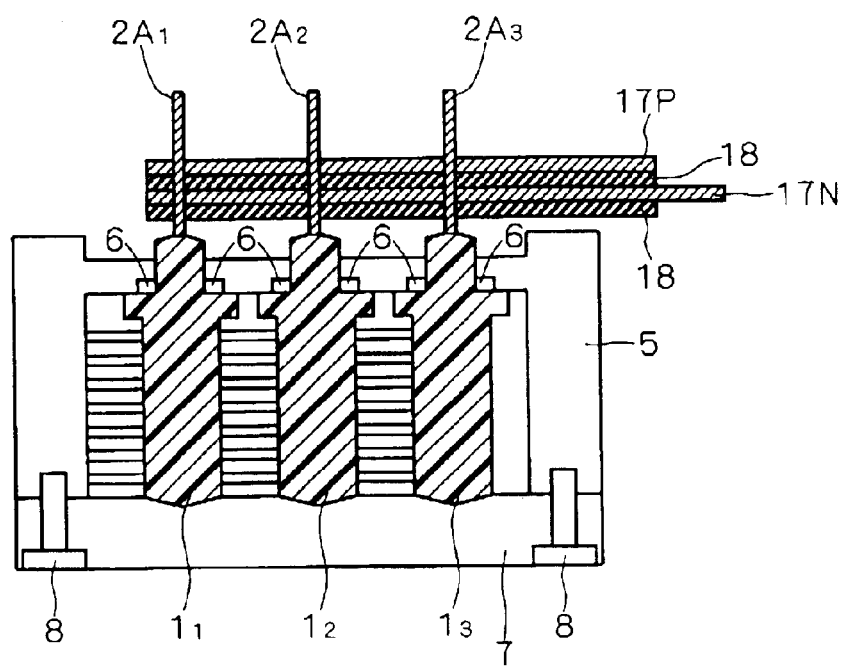
FIG. 24 is a cross section showing a cross-sectional structure taken along the line XXIV—XXIV of FIG. 23.

FIG. 23 is a top plan view showing a structure of a power semiconductor device in accordance with a fifth preferred embodiment of the present invention, correspondingly to FIG. 9, and FIG. 24 is a cross section showing a cross-sectional structure taken along the line XXIV—XXIV of FIG. 23. Referring to FIG. 23, a busbar 17 is provided instead of the busbars 10P and 10N of FIG. 9. Referring to FIG. 24, the busbar 17 has busbars 17P and 17N. The busbars 17P and 17N are each planar, and opposed to each other while being electrically insulated from each other by an insulating film 18. The busbar 17P is electrically connected to the main electrodes $2A_1$ to $2A_3$, and the busbar 17N is electrically connected to the main electrodes $2A_4$ to $2A_6$.

Thus, in the power semiconductor device of the fifth preferred embodiment, by providing the planar busbars 17P and 17N to be opposed to each other, it is possible to reduce the inductance between the busbars 17P and 17N as compared with that in the structure of FIG. 9.

Sixth Preferred Embodiment

Figure 25:
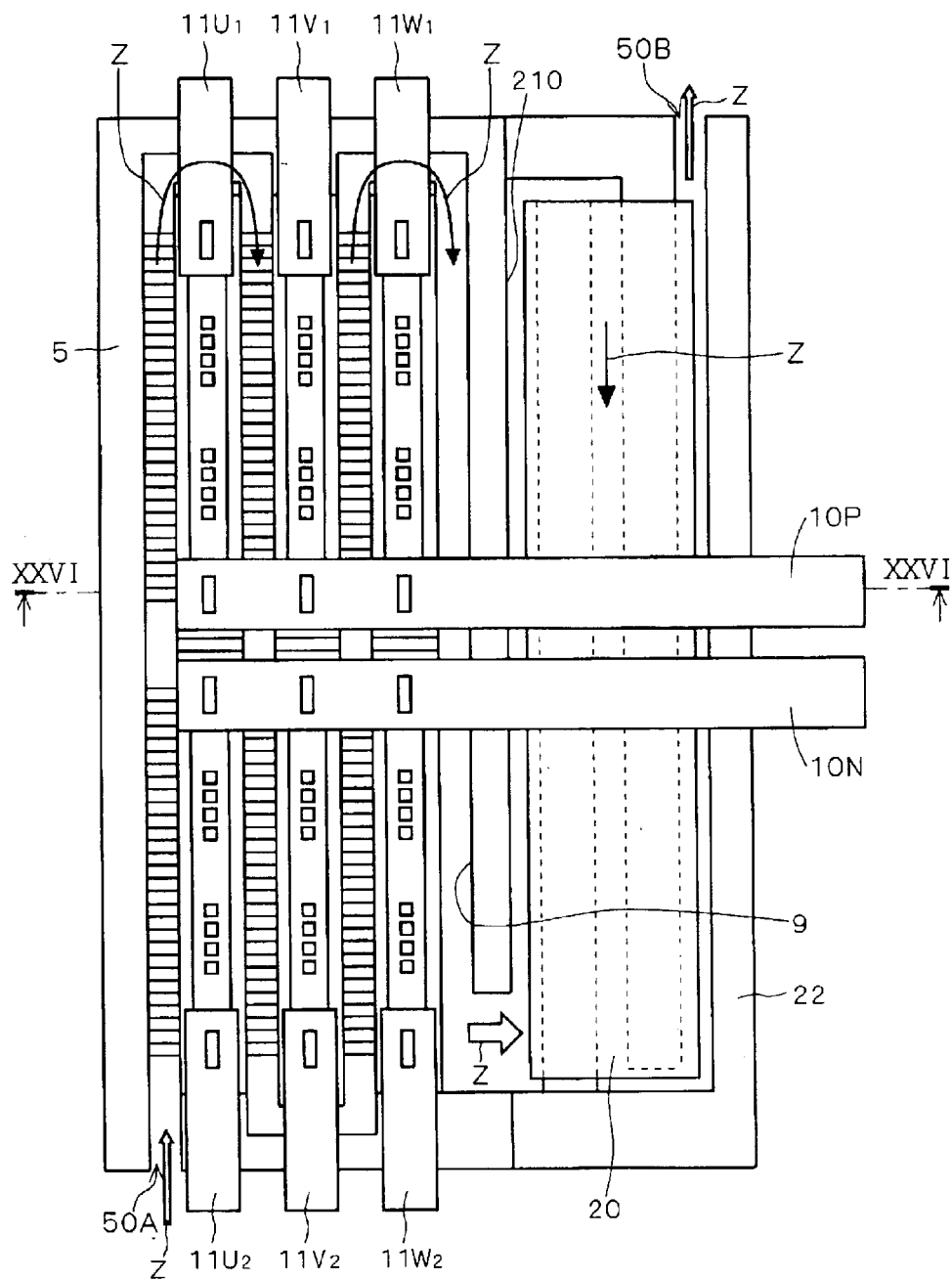
FIG. 25 is a top plan view showing a structure of a power semiconductor device in accordance with a sixth preferred embodiment of the present invention.
Figure 26:
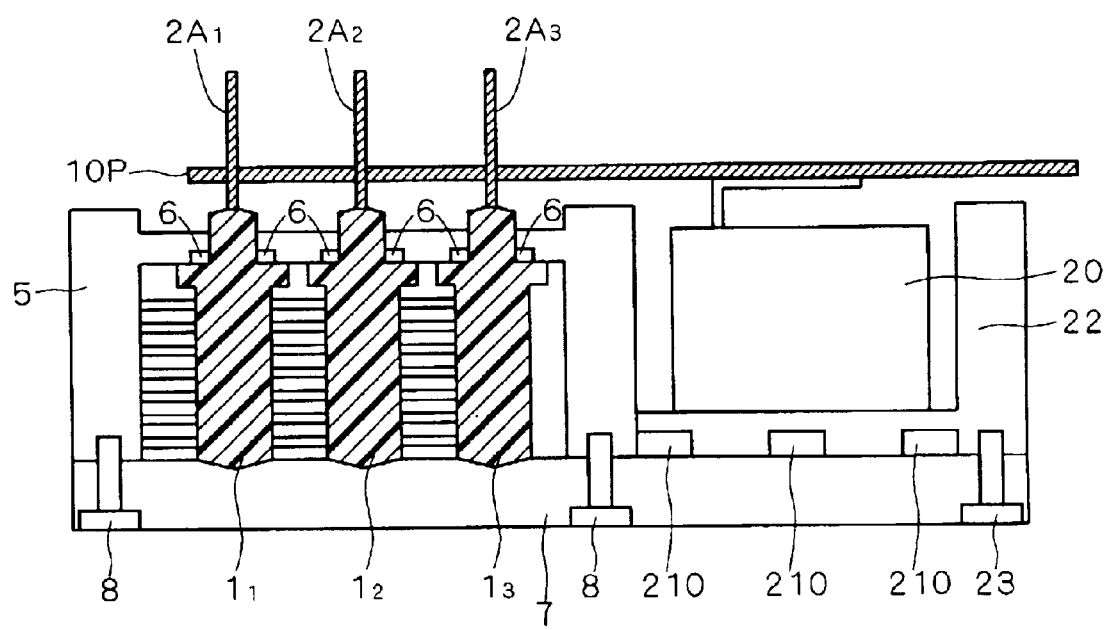
FIG. 26 is a cross section showing a cross-sectional structure taken along the line XXVI—XXVI of FIG. 25.

FIG. 25 is a top plan view showing a structure of a power semiconductor device in accordance with a sixth preferred embodiment of the present invention, correspondingly to FIG. 9, and FIG. 26 is a cross section showing a cross-sectional structure taken along the line XXVI—XXVI of FIG. 25. An electronic component (a smoothing capacitor 20 in the case of FIG. 25) constituting the power circuit together with the discrete semiconductor devices $1_1$ to $1_6$ is housed in the case together with the discrete semiconductor devices $1_1$ to $1_6$. The case consisting of case bodies 5 and 22 and the case bottom plate 7 which are fixed to each other with screws 8 and 23, and the smoothing capacitor 20 is disposed inside the case body 22. In the case body 22 formed is a duct 210 which is connected to the duct 9 for the coolant in the case body 5. As indicated by the arrow Z, the coolant flows from the coolant inlet 50A into the case body 5, going along the duct 9 while cooling the discrete semiconductor devices 1, and then flows into the case body 22, going along the duct 210 while cooling the smoothing capacitor 20. After that, the coolant flows out of the case body 22 from the coolant outlet 50B.

Figure 27:
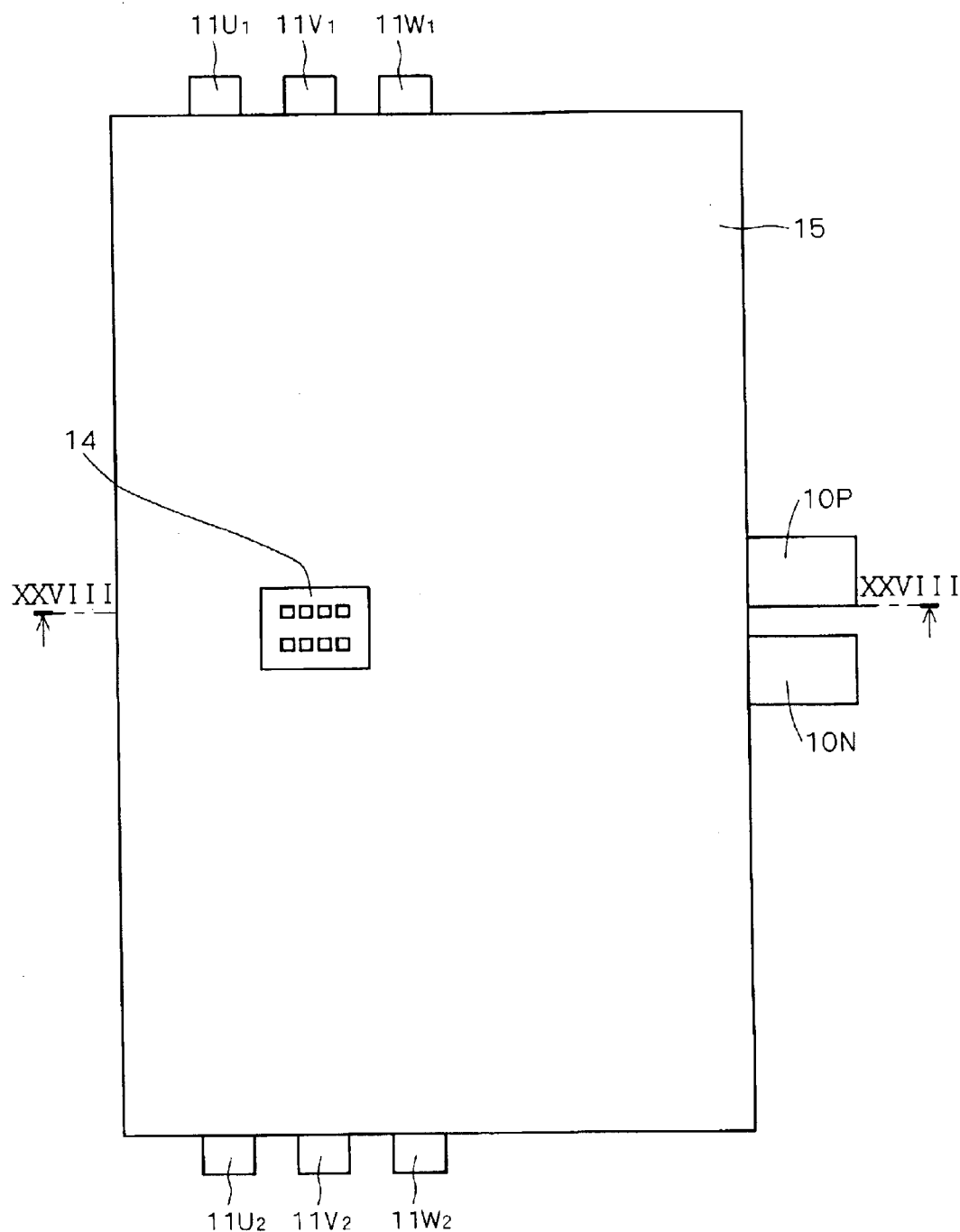
FIG. 27 is a top plan view showing a state where a control circuit substrate is mounted on the structure of FIG. 25 and this structure is covered with a case cover.
Figure 28:
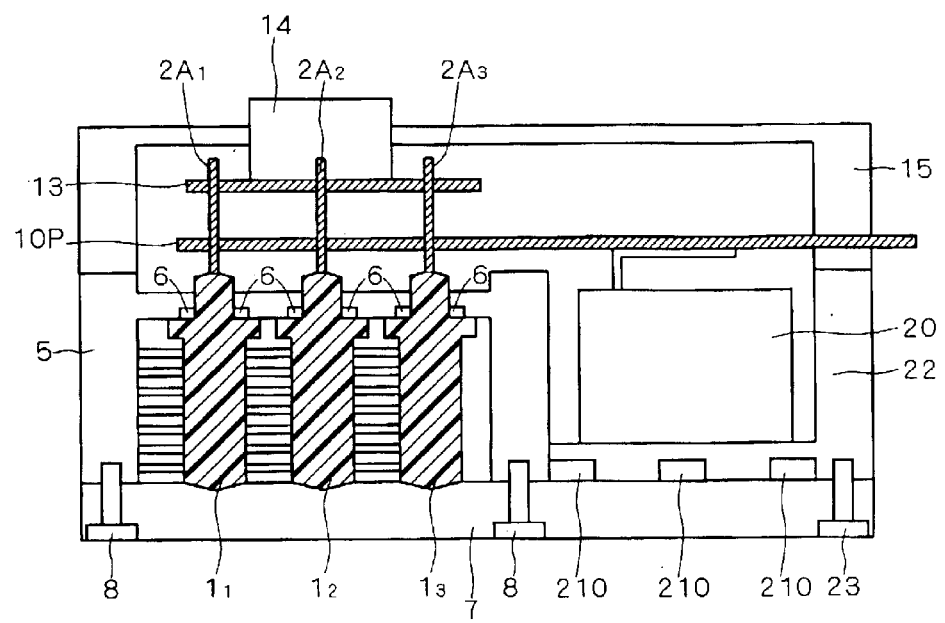
FIG. 28 is a cross section showing a cross-sectional structure taken along the line XXVIII—XXVIII of FIG. 27.

FIG. 27 is a top plan view showing a state where the control circuit substrate 13 is mounted on the structure of FIG. 25 and this structure is covered with the case cover 15, and FIG. 28 is a cross section showing a cross-sectional structure taken along the line XXVIII—XXVIII of FIG. 27. By providing the control circuit substrate 13 and the case cover 15, an IPM is obtained.

Thus, in the power semiconductor device of the sixth preferred embodiment, with the structure in which the smoothing capacitor 20 is cooled by the coolant used for cooling the discrete semiconductor devices $1_1$ to $1_6$, it is possible to ensure simplification and downsizing of the device.

Seventh Preferred Embodiment

Figure 29:
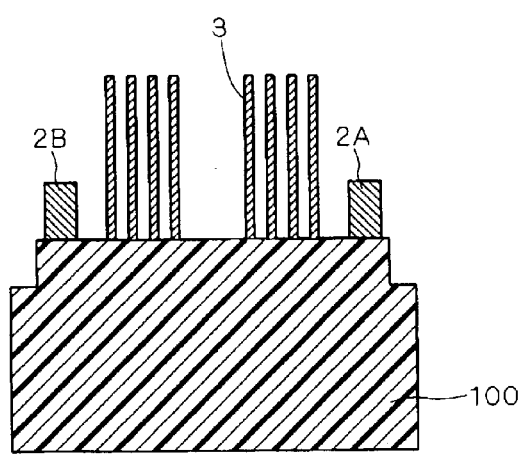
FIG. 29 is a cross section showing a structure of a discrete semiconductor device in accordance with a seventh preferred embodiment of the present invention.

FIG. 29 is a cross section showing a structure of a discrete semiconductor device 100 in accordance with a seventh preferred embodiment of the present invention, correspondingly to FIG. 3. The discrete semiconductor device 100 is different from the discrete semiconductor device 1 of FIG. 3 in that the main electrode 2A serving as an input terminal and the main electrode 2B serving as an output terminal are disposed inversely.

Figure 30:
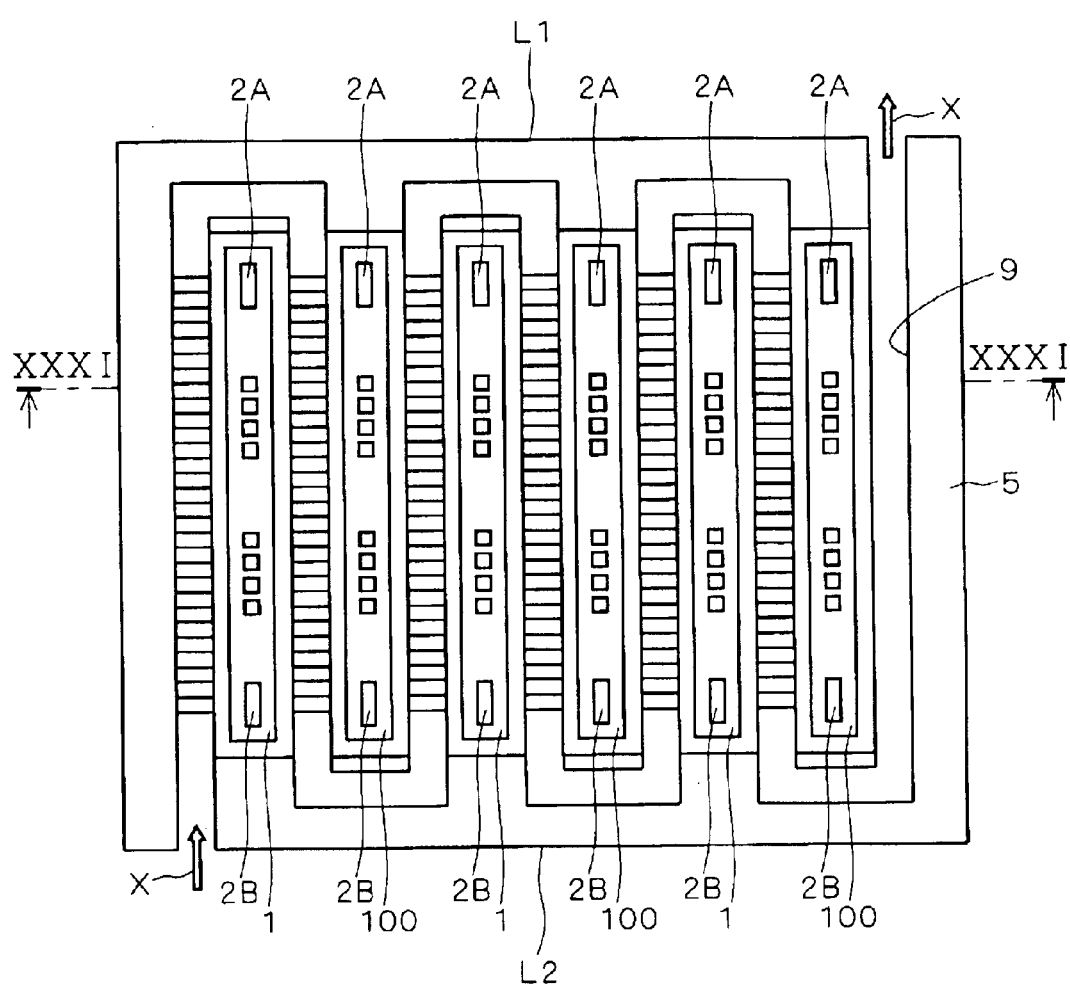
FIG. 30 is a top plan view showing a structure of a power semiconductor device in accordance with the seventh preferred embodiment of the present invention.
Figure 31:
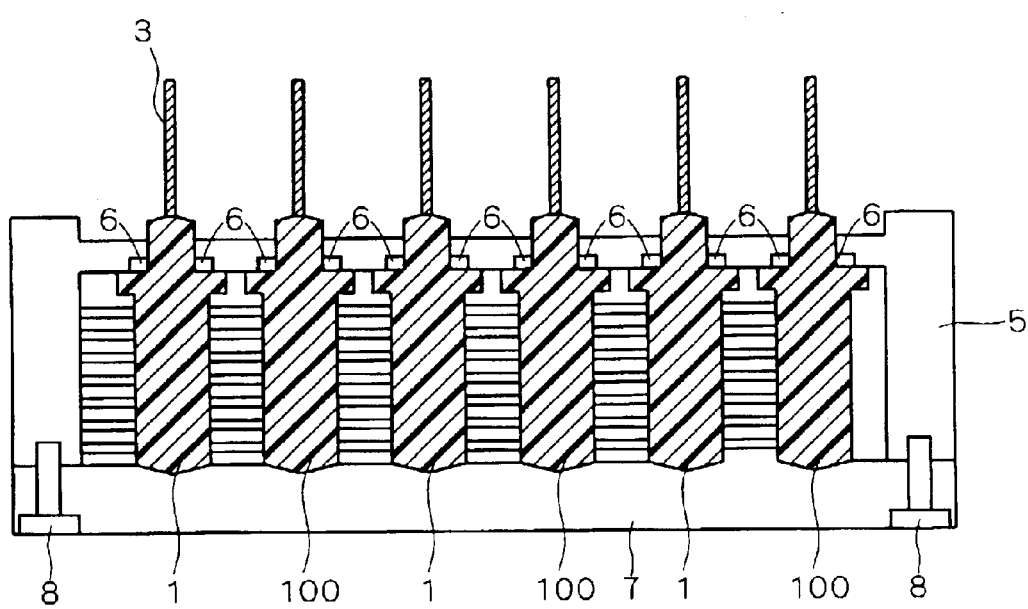
FIG. 31 is a cross section showing a cross-sectional structure taken along the line XXXI—XXXI of FIG. 30.

FIG. 30 is a top plan view showing a structure of a power semiconductor device in accordance with the seventh preferred embodiment of the present invention, correspondingly to FIG. 7, and FIG. 31 is a cross section showing a cross-sectional structure taken along the line XXXI—XXXI of FIG. 30. Referring to FIG. 30, the six discrete semiconductor devices 1 and 100 constituting the inverter circuit of FIG. 6 are arranged side by side in a matrix with one row and six columns inside the case. The discrete semiconductor devices 1 and the discrete semiconductor devices 100 are disposed alternately. The main electrodes 2A included in the discrete semiconductor devices 1 and 100 are arranged side by side along a first side L1 of the case. The main electrodes 2B included in the discrete semiconductor devices 1 and 100 are arranged side by side along a second side L2 of the case. In the case, the meandering duct 9 is defined among the discrete semiconductor devices 1 and 100.

Figure 32:
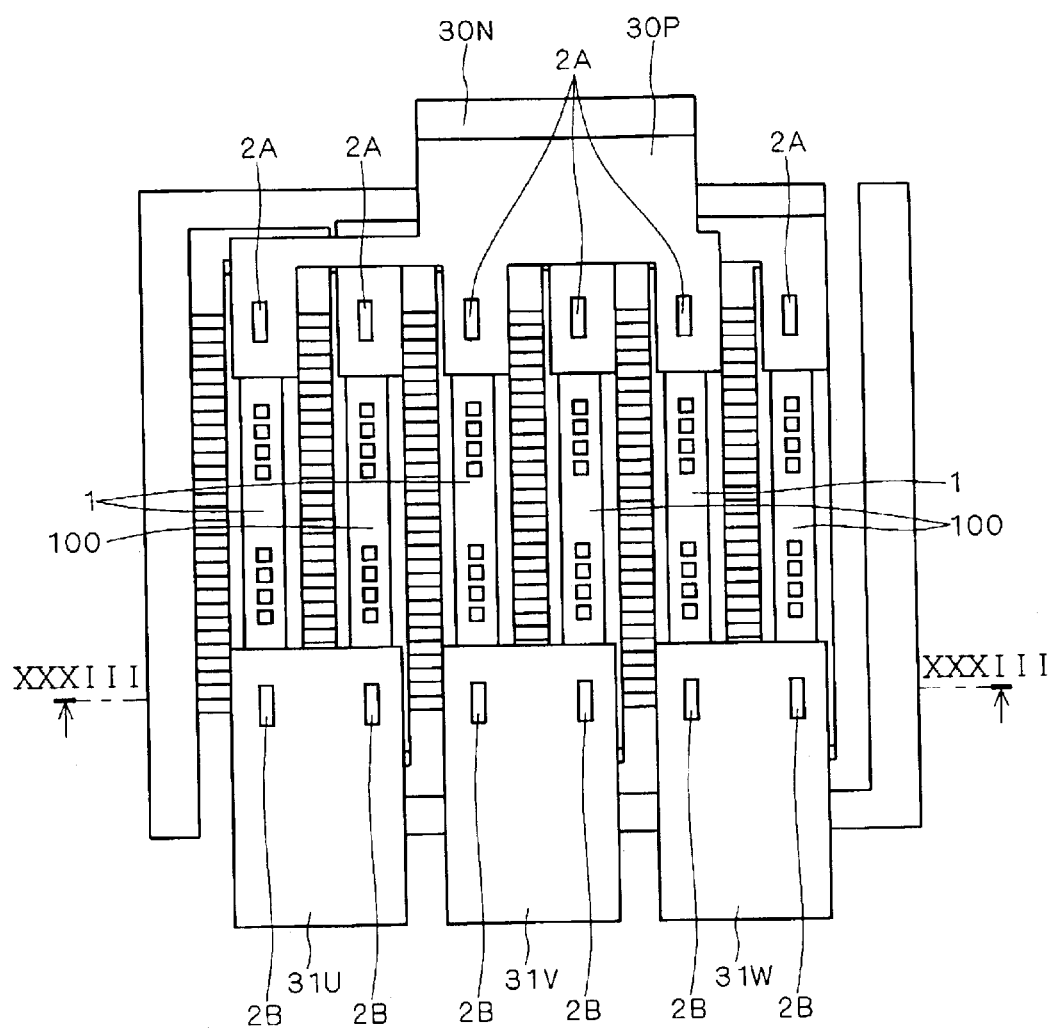
FIG. 32 is a top plan view showing a state where busbars are connected to the structure of FIG. 30.
Figure 33:
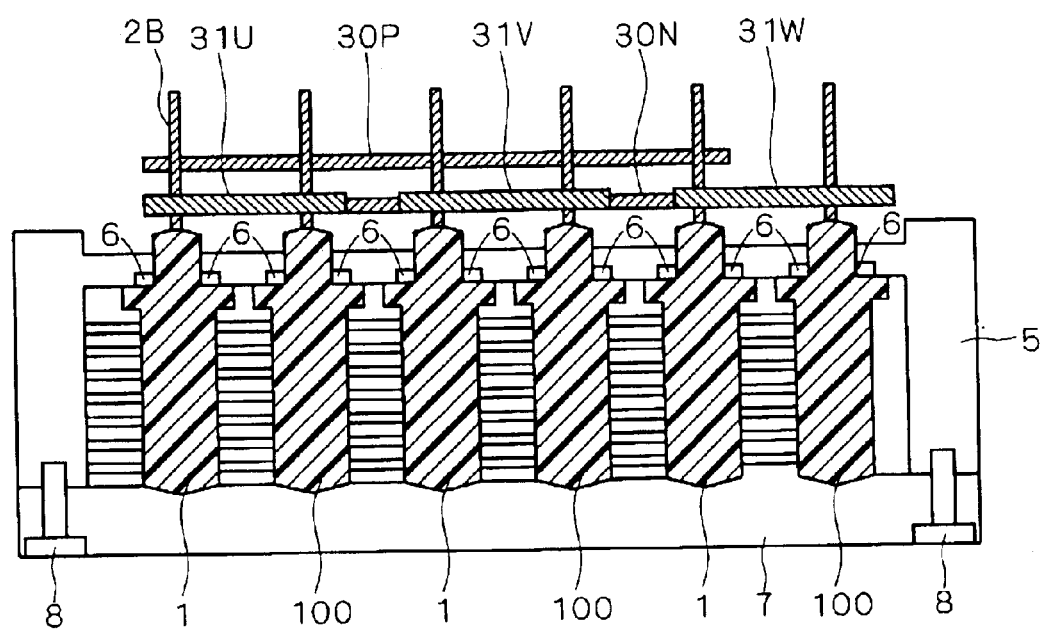
FIG. 33 is a cross section showing a cross-sectional structure taken along the line XXXIII—XXXIII of FIG. 32.

FIG. 32 is a top plan view showing a state where busbars are connected to the structure of FIG. 30, and FIG. 33 is a cross section showing a cross-sectional structure taken along the line XXXIII—XXXIII of FIG. 32. In FIG. 32, the upper wall of the case is not shown. FIG. 33 shows busbars 30P and 30N which are not actually seen in the cross section taken along the line XXXIII—XXXIII, together with the cross-sectional structure.

The input busbar 30P is connected in common to the main electrodes 2A included in the discrete semiconductor devices 1 and the input busbar 30N is connected in common to the main electrodes 2A included in the discrete semiconductor devices 100. The busbars 30P and 30N may be layered with an insulating film interposed therebetween, like in the structure of the above-discussed fifth preferred embodiment. Output busbars 31U, 31V and 31W are each connected to the main electrode 2B of the discrete semiconductor device 1 and the main electrode 2B of the discrete semiconductor device 100.

Figure 34:
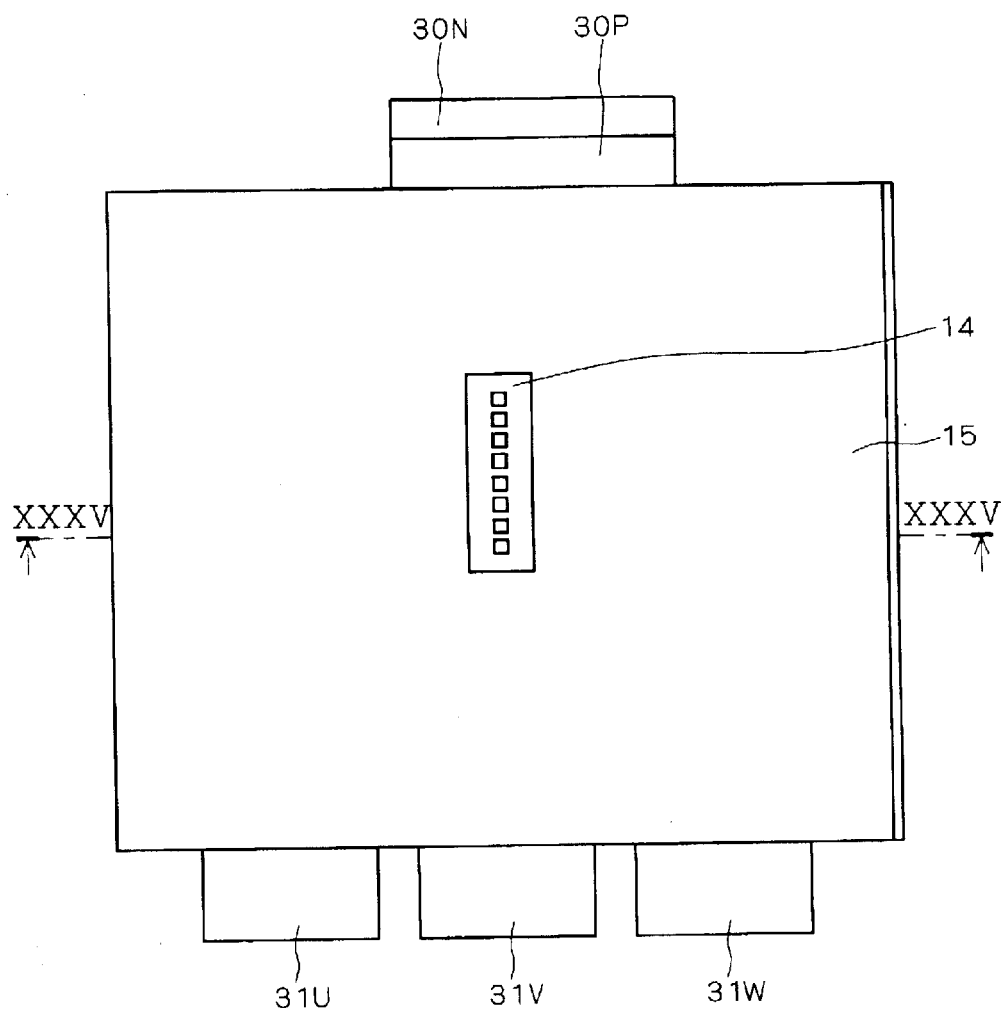
FIG. 34 is a top plan view showing a state where a control circuit substrate is mounted on the structure of FIG. 32 and this structure is covered with a case cover.
Figure 35:
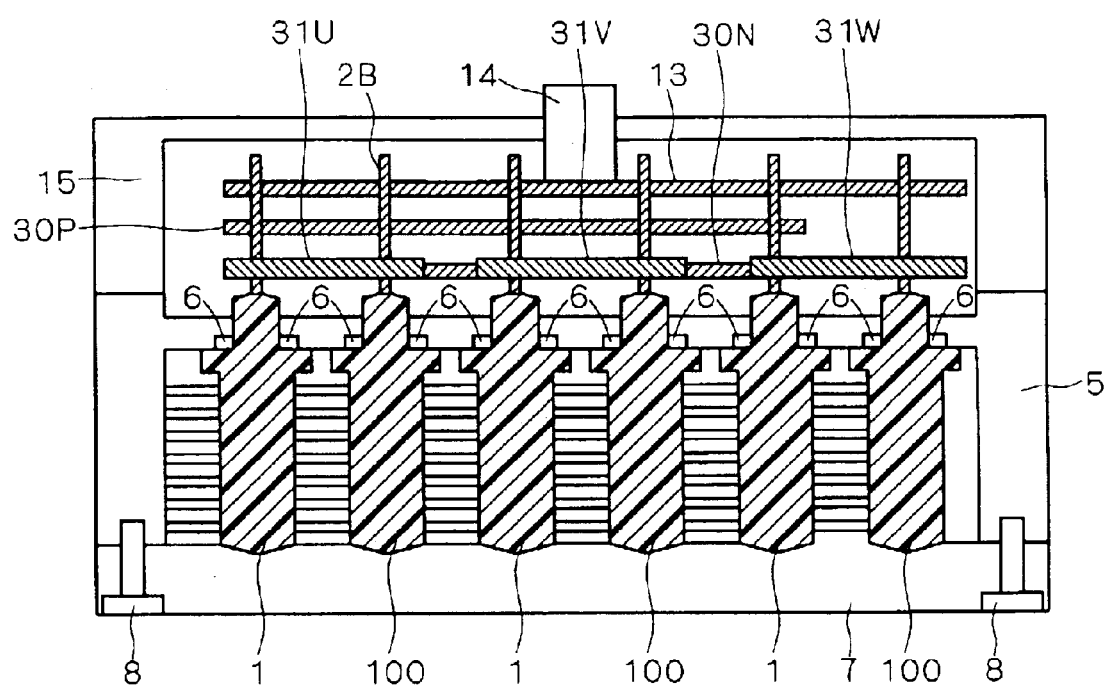
FIG. 35 is a cross section showing a cross-sectional structure taken along the line XXXV—XXXV of FIG. 34.

FIG. 34 is a top plan view showing a state where the control circuit substrate 13 is mounted on the structure of FIG. 32 and this structure is covered with the case cover 15, and FIG. 35 is a cross section showing a cross-sectional structure taken along the line XXXV—XXXV of FIG. 34. In FIG. 34, the upper wall of the case is not shown. FIG. 35 shows the main electrodes 2B and the busbars 30P, 30N, 31U, 31V and 31W which are not actually seen in the cross section taken along the line XXXV—XXXV, together with the cross-sectional structure. By providing the case body 5 with the control circuit substrate 13 and the case cover 15, an IPM is obtained.

The structure of FIG. 9 needs electrical connections between the busbars $11U_1$ and $11U_2$, between the busbars $11V_1$ and $11V_2$ and between the busbars $11W_1$ and $11W_2$ outside the case. Further, since the structure of FIG. 17 needs the grade-separated intersection of the busbars 11U, 11V and 11W and the busbars 10P and 10N, the interconnection becomes complicate. In contrast to these, the power semiconductor device of the seventh preferred embodiment eliminates such inconveniences and ensures simplification in device structure and interconnection.

Eighth Preferred Embodiment

Figure 36:
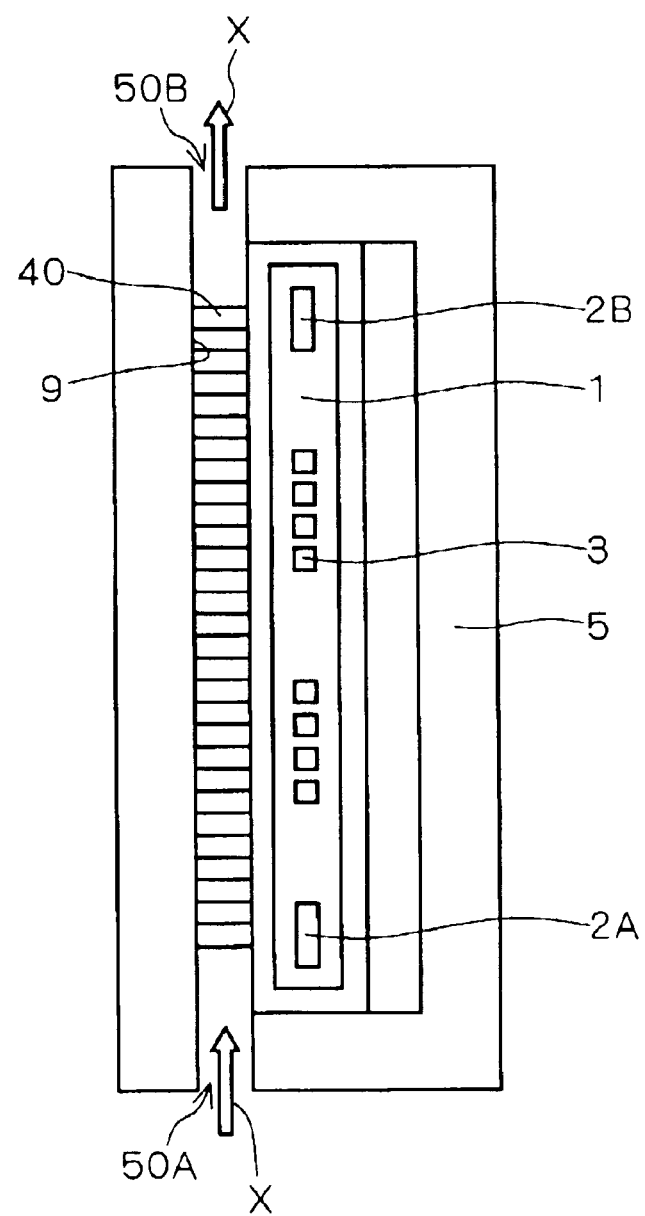
FIG. 36 is a top plan view showing a structure of a power semiconductor device in accordance with an eighth preferred embodiment of the present invention.

FIG. 36 is a top plan view showing a structure of a power semiconductor device in accordance with an eighth preferred embodiment of the present invention, correspondingly to FIG. 1. Instead of the resin fin 4 of FIG. 1, a fin 40 made of a metal such as copper is provided. This enhances the radiating efficiency of the discrete semiconductor device 1 as compared with the above-discussed first preferred embodiment.

Figure 37:
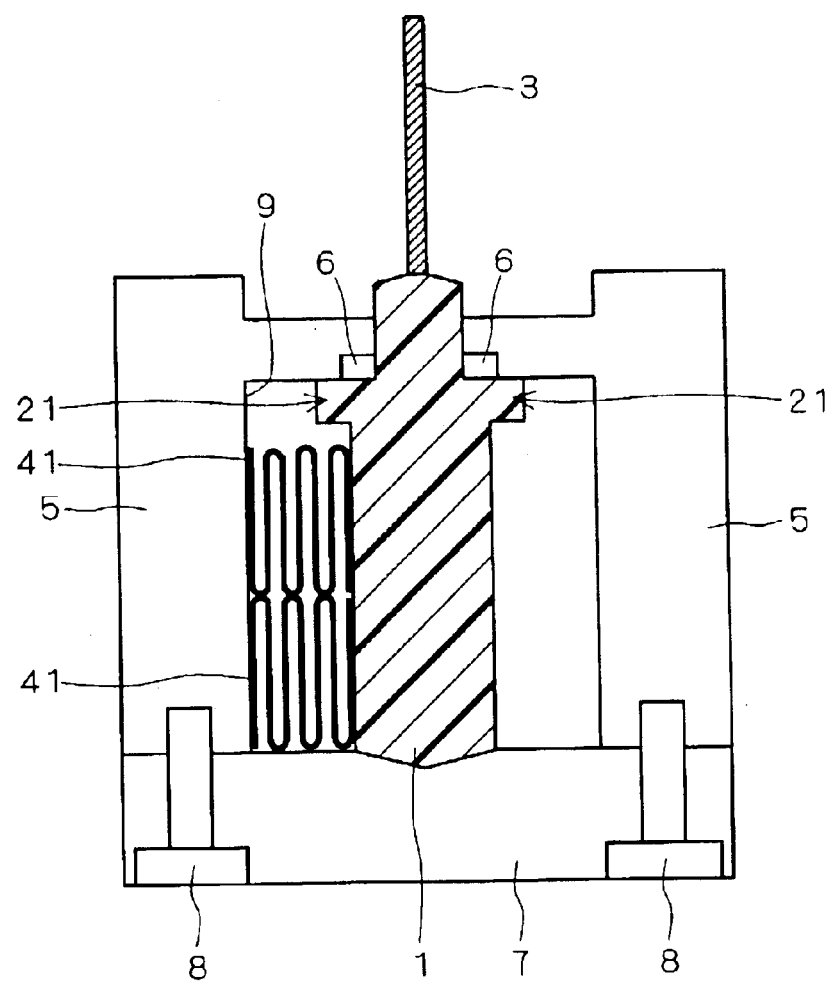
FIG. 37 is a cross section showing a variation of the eighth preferred embodiment of the present invention.

FIG. 37 is a cross section showing a variation of the eighth preferred embodiment of the present invention, correspondingly to FIG. 2. Instead of the fin 40 of FIG. 36, an elastic member 41 made of a metal such copper is disposed in the duct 9 for the coolant, being pressed by the side surface of the discrete semiconductor device 1. Specifically, the member 41 is sandwiched between the side surface of the discrete semiconductor device 1 and the inner wall of the case body 5 while being pressed, and presses the side surface of the discrete semiconductor device 1 with its elastic restoring force. The member 41 thereby surely contacts the side surface of the discrete semiconductor device 1 and therefore the heat from the discrete semiconductor device 1 is transferred to the coolant through the member 41. Though the fins 4 and 40 needs to join to the discrete semiconductor device 1 by soldering or the like, the member 41 only has to be inserted between the discrete semiconductor device 1 and the case body 5. Therefore, using the member 41 instead of the fin 4 or 40 allows an easy manufacture of the power semiconductor device.

Further, when the member 41 is used in the structure of FIG. 7 instead of the fin 4, the member 41 is sandwiched between the side surface of the discrete semiconductor device 1 and the inner wall of the case body 5 or between the side surfaces of the discrete semiconductor device 1.

Ninth Preferred Embodiment

Figure 38:
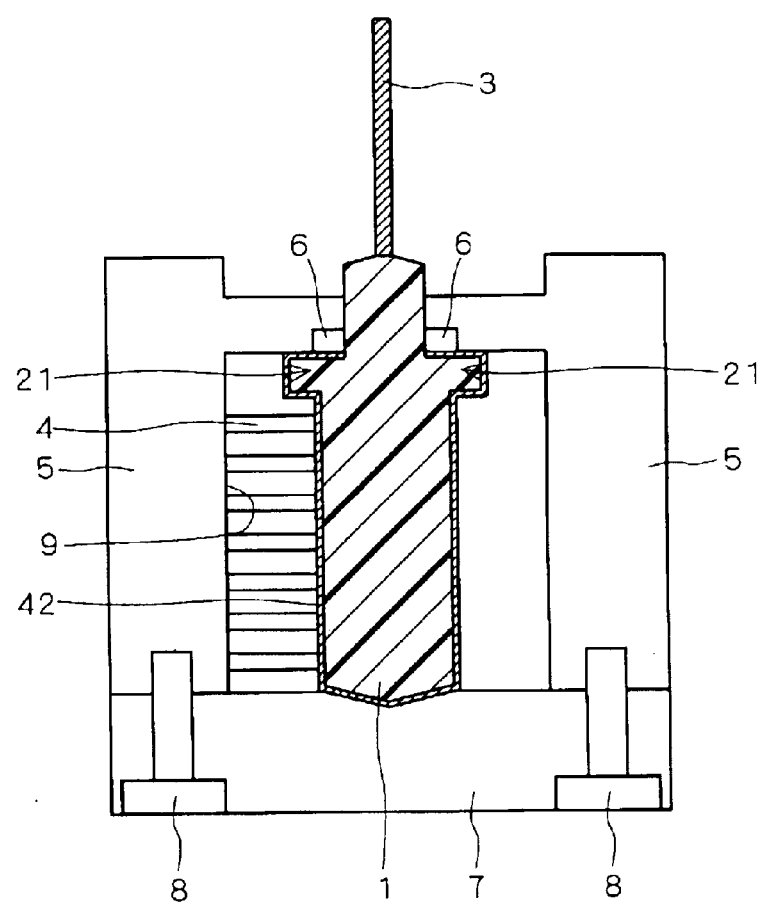
FIG. 38 is a cross section showing a structure of a power semiconductor device in accordance with a ninth preferred embodiment of the present invention.

FIG. 38 is a cross section showing a structure of a power semiconductor device in accordance with a ninth preferred embodiment of the present invention, correspondingly to FIG. 2. At least a portion of the surface of the discrete semiconductor device 1 which contacts the coolant is covered with a metal film 42. The metal film 42 is formed by plating, soldering or the like.

Thus, in the power semiconductor device of the ninth preferred embodiment, by providing the metal film 42, it is possible to enhance the heat radiation of the discrete semiconductor device 1 and the water resistance thereof against the coolant.

Though discussion has been made on the case of discrete semiconductor device having one-in-one function where a pair of input and output are provided, a multifunctional discrete semiconductor device having two-in-one function, six-in-one function, seven-in-one function or the like or a discrete semiconductor device including the function of an IC or the like may be used.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device, comprising:

a hollow case; and a discrete semiconductor device having a terminal for external connection, wherein said discrete semiconductor device is fitted in said case to be positioned and disposed on a predetermined portion inside said case with said terminal protruding outside from said case, and a space defined by a surface of said discrete semiconductor device and an inner wall of said case forms a duct for a coolant used for cooling said discrete semiconductor device which is immersed therein.

2. The power semiconductor device according to claim 1, wherein said case has a case body and a case bottom plate which are fixed to each other, and said discrete semiconductor device is sandwiched between said case bottom plate and said case body to be fixed inside said case.

3. The power semiconductor according to claim 1, wherein said discrete semiconductor device includes a plurality of discrete semiconductor devices, said case has a case body and a case bottom plate which are fixed to each other, and said plurality of discrete semiconductor devices are sandwiched between said case bottom plate and said case body to be fixed inside said case.

4. The power semiconductor device according to claim 1, wherein said discrete semiconductor device has a structure in which a power semiconductor element is sealed with a resin.

5. The power semiconductor device according to claim 1, wherein said terminal includes a plurality of terminals, and all said plurality of terminals protrude from one surface of said discrete semiconductor device.

6. The power semiconductor device according to claim 1, wherein said discrete semiconductor device further has a positioning structure to be fitted in said case, for defining an arrangement position in said case.

7. The power semiconductor device according to claim 1, further comprising an elastic member made of a metal, being disposed in said space while being pressed by said surface of said discrete semiconductor device.

8. The power semiconductor device according to claim 1, further comprising a fin disposed on said surface of said discrete semiconductor device.

9. The power semiconductor device according to claim 1, further comprising a metallic film covering said surface of said discrete semiconductor device.

10. The power semiconductor device according to claim 1, wherein said discrete semiconductor device includes a plurality of discrete semiconductor devices, said plurality of discrete semiconductor devices constitute a predetermined power circuit, and said plurality of discrete semiconductor devices are arranged side by side in said case.

11. The power semiconductor device according to claim 10, wherein said terminal includes a first input terminal and a second input terminal, said plurality of discrete semiconductor devices each have said first input terminal and said second input terminal, said first input terminals included in said plurality of discrete semiconductor devices are electrically connected to each other with a first busbar, said second input terminals included in said plurality of discrete semiconductor devices are electrically connected to each other with a second busbar, and said first busbar and said second busbar are disposed adjacently to each other.

12. The power semiconductor device according to claim 11, wherein both said first and second busbars are planar, and said first and second busbars are insulated from each other and opposed to each other.

13. The power semiconductor device according to claim 10, wherein said plurality of discrete semiconductor devices are disposed from an upstream side of said duct for said coolant in descending order of calorific value.

14. The power semiconductor device according to claim 10, wherein said terminal includes a predetermined input terminal and a signal terminal, said plurality of discrete semiconductor devices each have said input terminal and said signal terminal, and said input terminals included in said plurality of discrete semiconductor devices are electrically connected to each other with a busbar, said power semiconductor device further comprising:

a control circuit substrate electrically connected to said plurality of discrete semiconductor devices through said signal terminals, on which a control circuit is former to control said plurality of discrete semiconductor devices; and a shield plate disposed between said control circuit substrate and said busbar, being connected to said case.

15. The power semiconductor device according to claim 10, wherein said terminal includes a predetermined input terminal and a predetermine output terminal, said plurality of discrete semiconductor devices each have said input terminal and said output terminal, said input terminals included in said plurality of discrete semiconductor device are arranged side by side along a first side of said case, and said output terminals included in said plurality of discrete semiconductor devices are arranged side by side along a second side of said case which is opposed to said first side.

16. The power semiconductor device according to claim 1, further comprising an electronic component constituting a predetermined power circuit, together with said discrete semiconductor device, wherein said electronic component is disposed in said case and cooled by said coolant.

17. The power semiconductor device according to claim 1, wherein said case has a case body forming side walls and a bottom wall of said case as one unit and a case top plate fixed to said case body.

18. The power semiconductor device according to claim 17, wherein said case body is made of a metal.

19. The power semiconductor device according to claim 1, further comprising:

a coolant outlet disposed in linear relationship with the coolant inlet such that the coolant only cools the first side surface of the discrete semiconductor element.

20. The power semiconductor device according to claim 1, further comprising:

a coolant outlet dispersed on a same side of the coolant inlet, wherein the duct comprises a U-shape such that the coolant flows into the coolant inlet, through the U-shaped duct, and out of the coolant outlet such that both side surfaces of the discrete semiconductor element are cooled.

21. The power semiconductor device according to claim 1, further comprising:

a coolant inlet disposed substantially in parallel with the duct and the discrete semiconductor device such that the coolant flows along a first side surface of the discrete semiconductor element.

* * * * *